(12) United States Patent
Nishio et al.

(10) Patent No.: US 12,308,828 B2
(45) Date of Patent: May 20, 2025

(54) RADIO-FREQUENCY MODULE AND COMMUNICATION DEVICE

(71) Applicant: Murata Manufacturing Co., Ltd., Kyoto (JP)

(72) Inventors: Keisuke Nishio, Kyoto (JP); Yukiteru Sugaya, Kyoto (JP); Masaki Tada, Kyoto (JP); Masanori Kato, Kyoto (JP); Syunsuke Kido, Kyoto (JP); Hiroshi Matsubara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 230 days.

(21) Appl. No.: 17/818,990

(22) Filed: Aug. 11, 2022

(65) Prior Publication Data

US 2023/0112175 A1    Apr. 13, 2023

(30) Foreign Application Priority Data

Oct. 13, 2021 (JP) ................................. 2021-168437

(51) Int. Cl.
H03H 9/72     (2006.01)
H03H 9/02     (2006.01)
H04B 1/40     (2015.01)

(52) U.S. Cl.
CPC ........ H03H 9/725 (2013.01); H03H 9/02015 (2013.01); H04B 1/40 (2013.01)

(58) Field of Classification Search
CPC .. H03H 9/725; H03H 9/02015; H03H 7/0115; H03H 7/1758; H03H 7/1766; H03H 7/463; H03H 9/0542; H03H 9/0576; H03H 9/6483; H04B 1/40

USPC ......................... 333/133, 186–188, 193–196
See application file for complete search history.

(56) References Cited

U.S. PATENT DOCUMENTS

| 2006/0094393 | A1  | 5/2006 | Okuyama et al. |
| 2015/0126134 | A1  | 5/2015 | Lobianco et al. |
| 2016/0094199 | A1* | 3/2016 | David ............... H03H 3/0073 |
| | | | 333/32 |

(Continued)

FOREIGN PATENT DOCUMENTS

| CN | 113497636 A | 10/2021 |
| JP | 2004-297369 A | 10/2004 |

(Continued)

*Primary Examiner* — Jorge L Salazar, Jr.
(74) *Attorney, Agent, or Firm* — McDonald Hopkins LLC

(57) ABSTRACT

In a radio-frequency module, a hybrid filter includes an acoustic wave filter including at least one acoustic wave resonator, an inductor having a winding portion, and a capacitor. A plurality of outer electrodes of the acoustic wave filter includes a first input and output electrode connected to a first signal terminal, a second input and output electrode connected to a second signal terminal, and a ground electrode connected to a ground terminal. The inductor is disposed on a first major surface of a mounting substrate and is adjacent to the acoustic wave filter in plan view in a thickness direction of the mounting substrate. When viewed in a direction of a winding axis of the winding portion of the inductor, an inner part of the winding portion in the inductor does not overlap any of the first input and output electrode, the second input and output electrode, and ground electrode.

16 Claims, 17 Drawing Sheets

(56) References Cited

U.S. PATENT DOCUMENTS

| | | | |
|---|---|---|---|
| 2018/0026606 A1* | 1/2018 | Takata | H04L 5/1461 |
| | | | 370/278 |
| 2018/0131345 A1* | 5/2018 | Fukuda | H10N 30/20 |
| 2019/0013789 A1 | 1/2019 | Mori | |
| 2020/0186126 A1* | 6/2020 | Miyazaki | H03H 9/25 |
| 2020/0228155 A1 | 7/2020 | Kido | |

FOREIGN PATENT DOCUMENTS

| | | |
|---|---|---|
| JP | 2006-279604 A | 10/2006 |
| JP | 2007-150566 A | 6/2007 |
| JP | 2008-193739 A | 8/2008 |
| JP | 2019-176172 A | 10/2019 |
| WO | 2015/098240 A1 | 7/2015 |
| WO | 2017/159112 A1 | 9/2017 |
| WO | 2019/064990 A1 | 4/2019 |

* cited by examiner

RADIO-FREQUENCY MODULE AND COMMUNICATION DEVICE

CROSS REFERENCE TO RELATED APPLICATION

This application claims priority from Japanese Patent Application No. 2021-168437 filed on Oct. 13, 2021. The content of this application is incorporated herein by reference in its entirety.

BACKGROUND OF THE DISCLOSURE

1. Field of the Disclosure

The present disclosure generally relates to a radio-frequency module and a communication device and, more specifically, to a radio-frequency module that includes an inductor, and a communication device that includes the radio-frequency module.

2. Description of the Related Art

WO2019/064990 describes a radio-frequency filter (radio-frequency module) that uses a hybrid filter. The radio-frequency filter includes a substrate (mounting substrate), acoustic wave resonators, an inductor, and a capacitor. The acoustic wave resonators and the inductor are mounted on a major surface (first major surface) of the substrate.

With the radio-frequency module in which an acoustic wave filter and the inductor are disposed on the first major surface of the mounting substrate, the characteristics of the radio-frequency module can be decreased under the influence of the magnetic field generated by the inductor.

BRIEF SUMMARY OF THE DISCLOSURE

It is a possible benefit of the present disclosure to provide a radio-frequency module and a communication device capable of suppressing a decrease in the characteristics of a radio-frequency module.

According to one aspect of the present disclosure, a radio-frequency module includes a mounting substrate, a first signal terminal, a second signal terminal, a ground terminal, and a hybrid filter. The mounting substrate has a first major surface and a second major surface facing each other. The first signal terminal, the second signal terminal, and the ground terminal are disposed on the second major surface of the mounting substrate. The hybrid filter is connected between the first signal terminal and the second signal terminal. The hybrid filter includes an acoustic wave filter including at least one acoustic wave resonator, an inductor having a winding portion, and a capacitor. The acoustic wave filter has a plurality of outer electrodes connected to the first major surface of the mounting substrate. The plurality of outer electrodes includes a first input and output electrode connected to the first signal terminal, a second input and output electrode connected to the second signal terminal, and a ground electrode connected to the ground terminal. The inductor is disposed on the first major surface of the mounting substrate and is adjacent to the acoustic wave filter in plan view in a thickness direction of the mounting substrate. When viewed in a direction of a winding axis of the winding portion of the inductor, an inner part of the winding portion in the inductor does not overlap any of the first input and output electrode, the second input and output electrode, and the ground electrode.

According to an aspect of the present disclosure, a communication device includes the above-described radio-frequency module and a signal processing circuit. The signal processing circuit is connected to the radio-frequency module.

DETAILED DESCRIPTION OF THE DISCLOSURE

Figure 1:
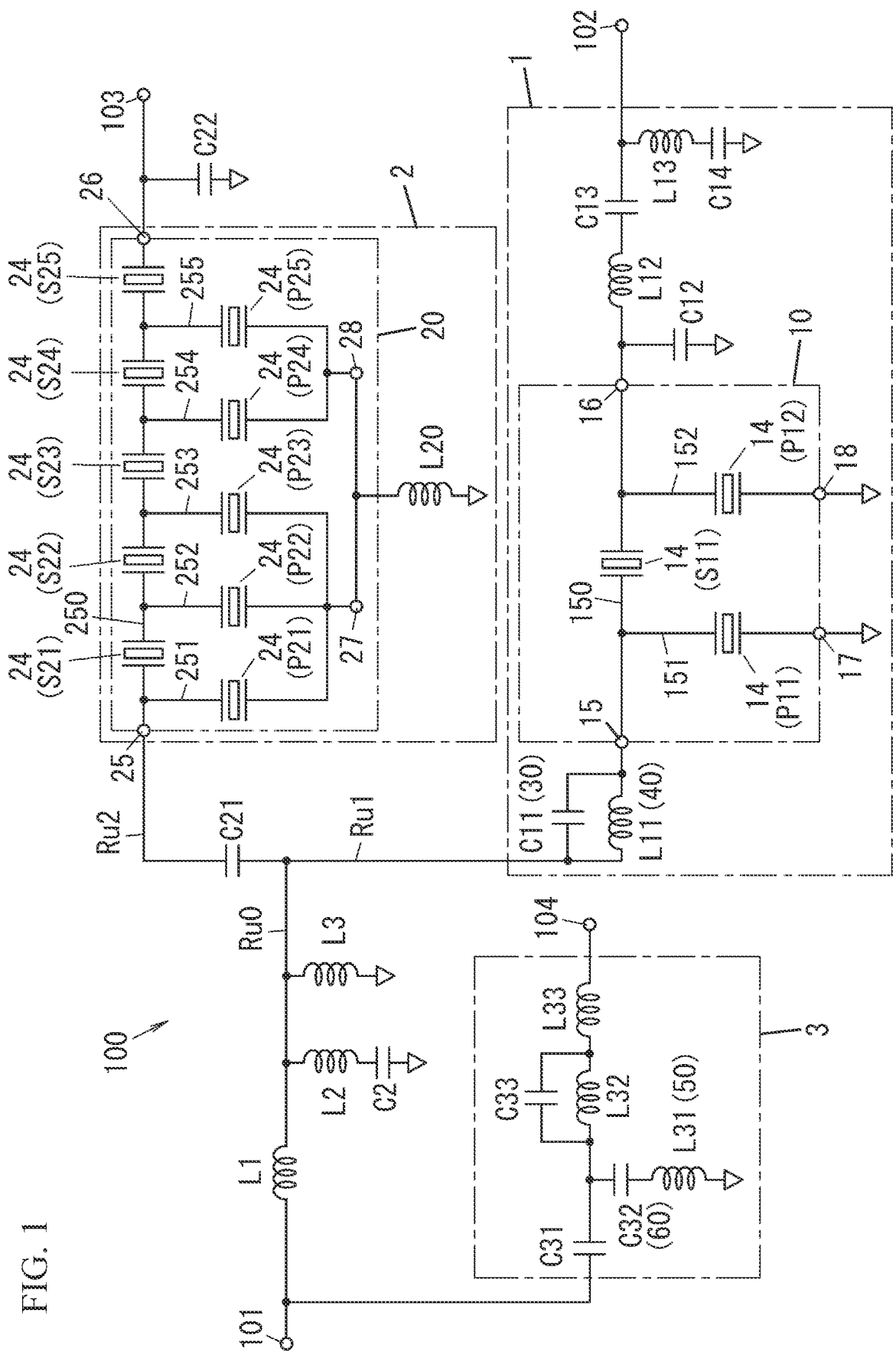
FIG. 1 is a circuit diagram of a radio-frequency module according to a first embodiment.

Figures that will be referenced in the following embodiments and the like all are schematic diagrams, and the ratios of the sizes and thicknesses of the component elements in the drawings do not always reflect actual scale ratios.

First Embodiment

Hereinafter, a radio-frequency module 100 and a communication device 300 according to a first embodiment will be described with reference to FIG. 1 to FIG. 10.

(1) Outline

As shown in FIG. 1, the radio-frequency module 100 according to the first embodiment includes a first signal terminal 101, a second signal terminal 102, ground terminals 107 (see FIG. 3), and a hybrid filter 1. The hybrid filter 1 is connected between the first signal terminal 101 and the second signal terminal 102. The phrase "the hybrid filter 1 is connected between the first signal terminal 101 and the second signal terminal 102" means that the hybrid filter 1 is connected to both the first signal terminal 101 and the second signal terminal 102 between the first signal terminal 101 and the second signal terminal 102. The hybrid filter 1 includes an acoustic wave filter 10, an inductor 40, and a capacitor 30. In the radio-frequency module 100, the hybrid filter 1 includes a plurality of inductors L11, L12, L13 and a plurality of capacitors C11, C12, C13, C14. The inductor L11 is the inductor 40. The capacitor C11 is the capacitor 30. The acoustic wave filter 10 (hereinafter, also referred to as first acoustic wave filter 10) includes at least one (for example, three) acoustic wave resonator 14. The hybrid filter 1 is a wide-band band pass filter made up of the plurality of inductors L12, L13 and the plurality of capacitors C12, C14. In the hybrid filter 1, the acoustic wave filter 10 is used to attenuate a specific band in the pass band of the band pass filter. In the radio-frequency module 100, a chip inductor is adopted as the inductor 40 to increase the quality factor of the inductor 40.

Figure 2:
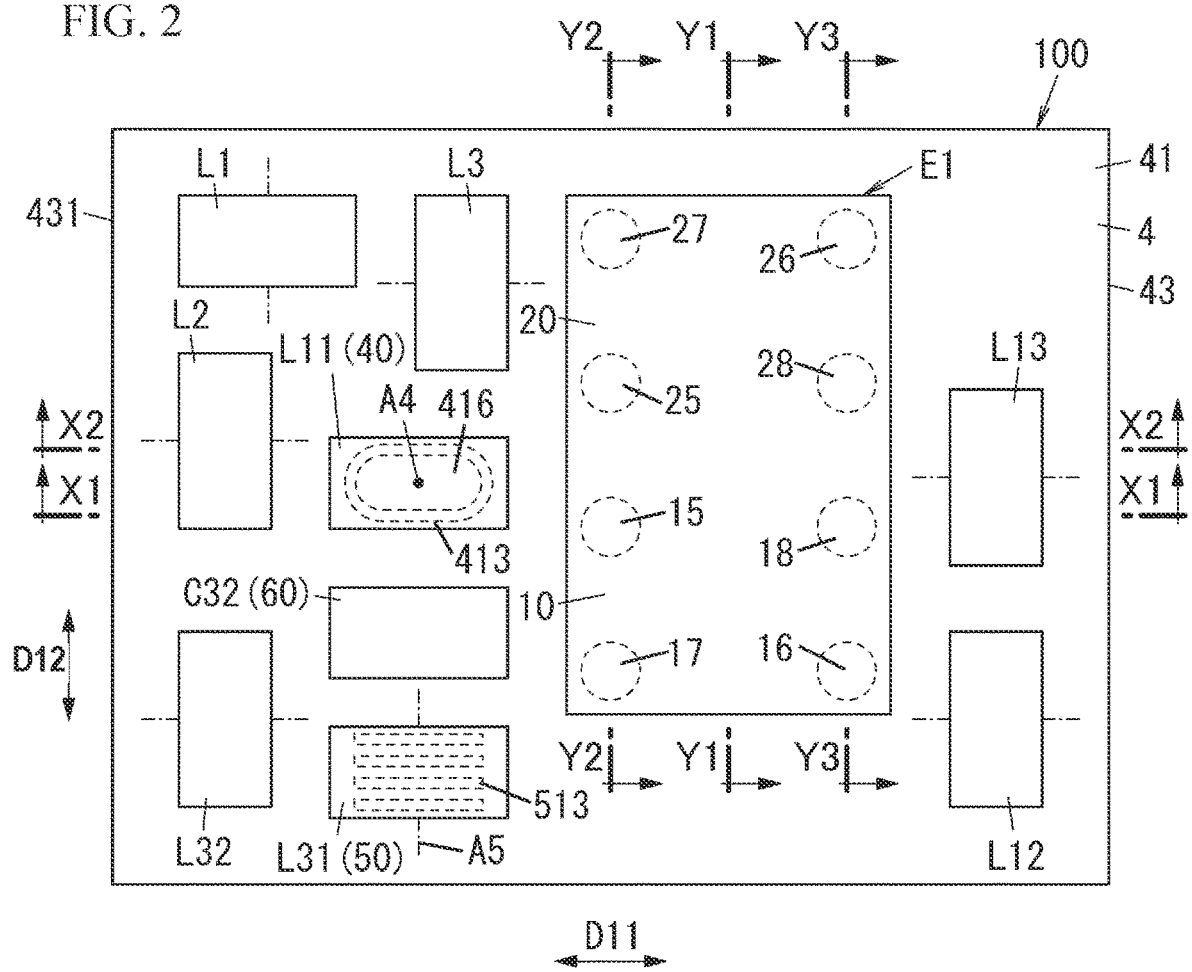
FIG. 2 is a plan view of the radio-frequency module.
Figure 3:
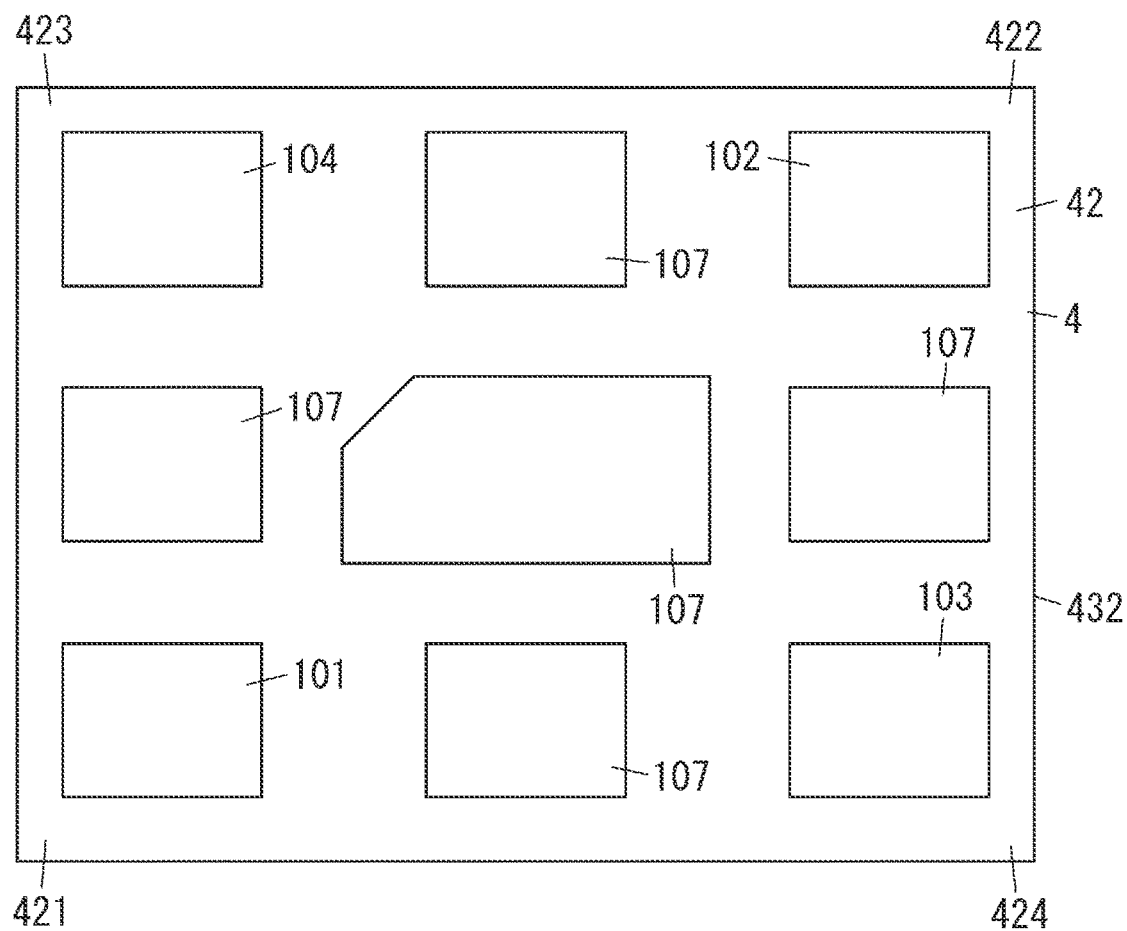
FIG. 3 is a bottom view of the radio-frequency module.
Figure 6:
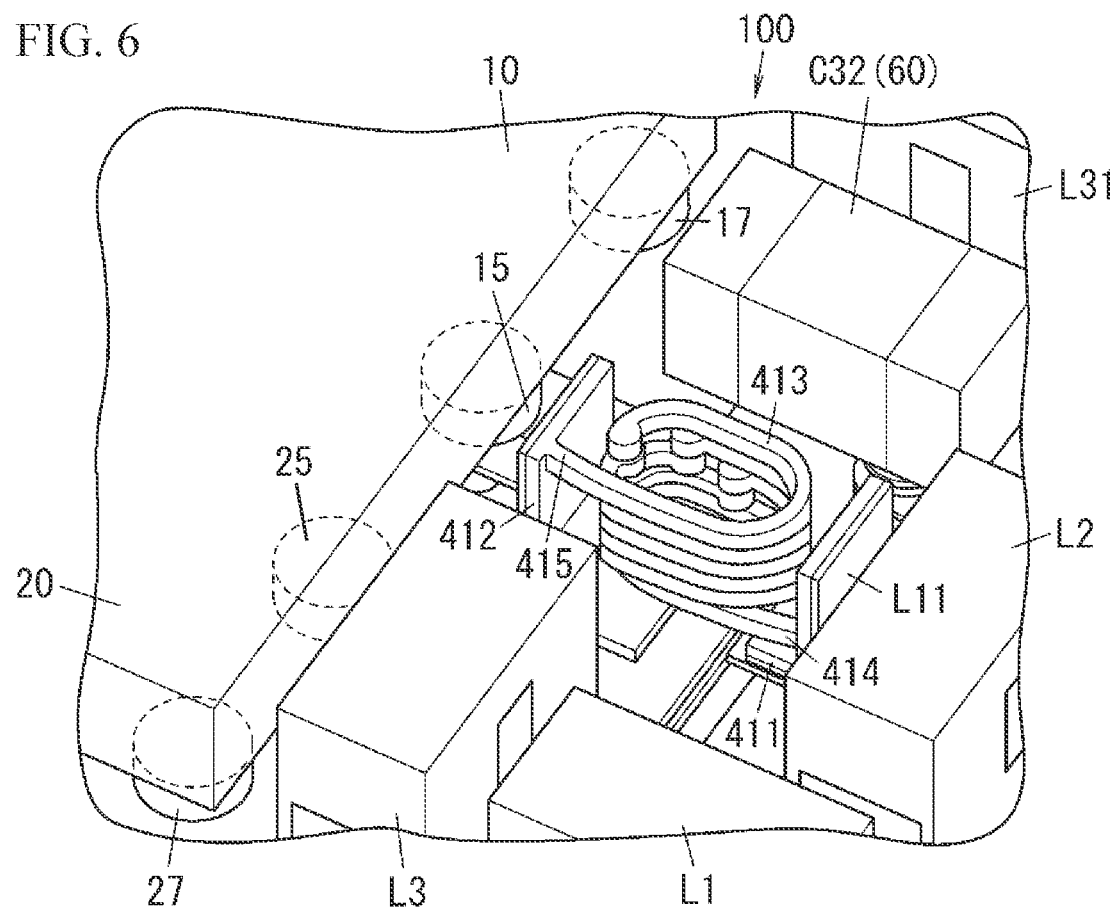
FIG. 6 shows the radio-frequency module and is a see-through perspective view of the inside of one inductor adjacent to an acoustic wave filter.
Figure 7A:
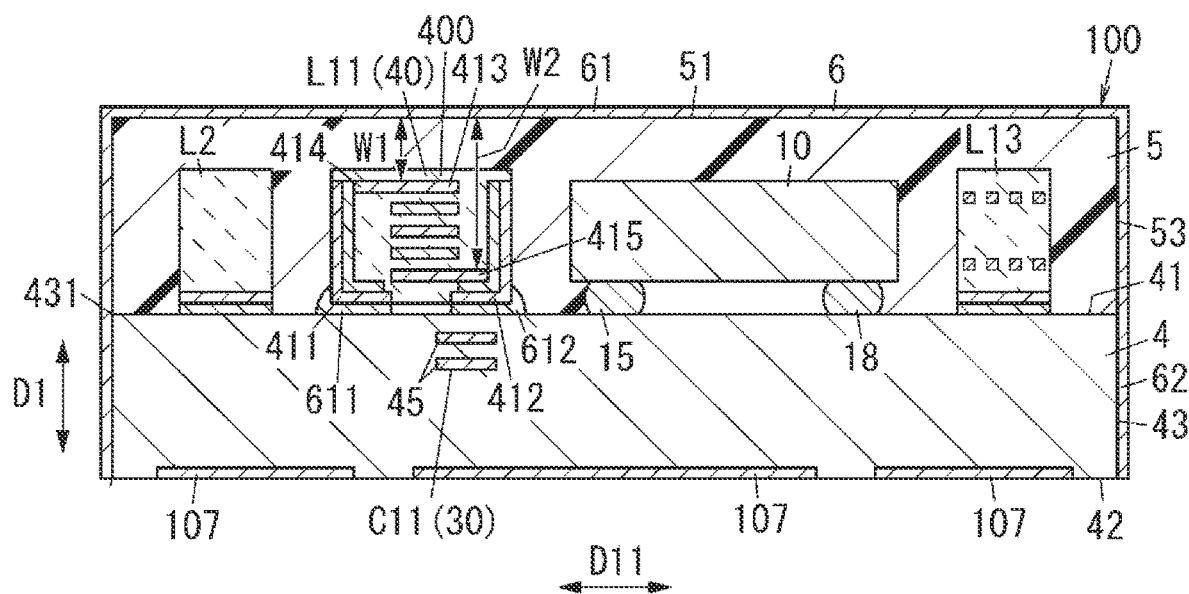
FIG. 7A is a cross-sectional view of the radio-frequency module, taken along the line X1-X1 in FIG. 2.
Figure 7B:
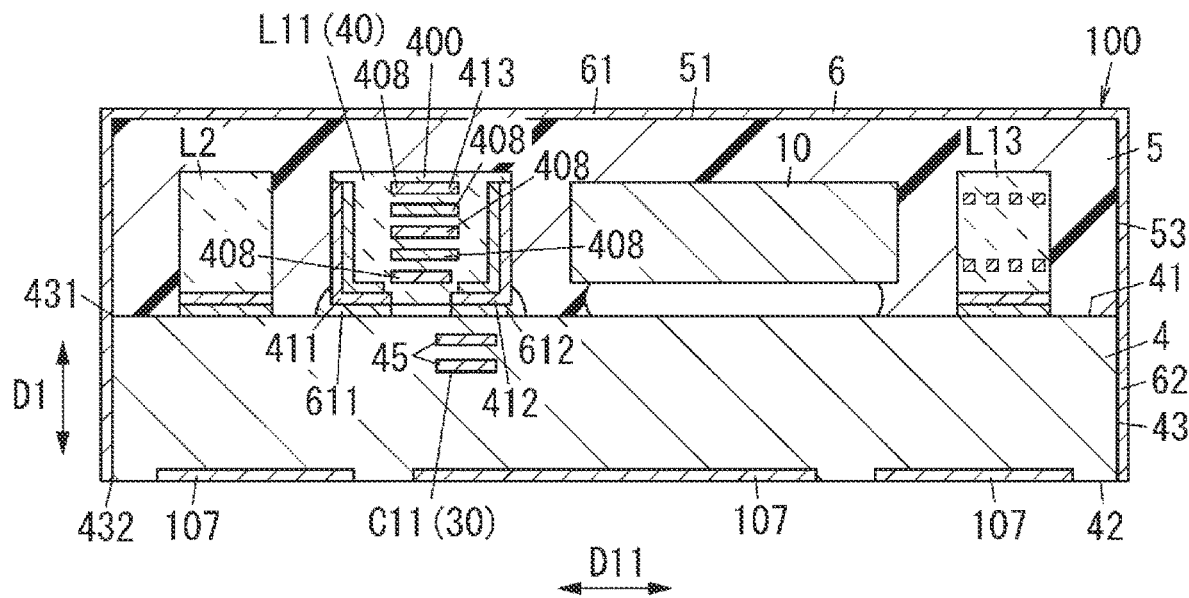
FIG. 7B is a cross-sectional view of the radio-frequency module, taken along the line X2-X2 in FIG. 2.

As shown in FIG. 2 to FIG. 6, the radio-frequency module 100 includes a mounting substrate 4. As shown in FIG. 6, FIG. 7A, and FIG. 7B, the mounting substrate 4 has a first major surface 41 and a second major surface 42 facing each other. Here, the word "facing" means not physically facing but geometrically facing. As shown in FIG. 3, the first signal terminal 101, the second signal terminal 102, and the ground terminals 107 are disposed on the second major surface 42 of the mounting substrate 4. As shown in FIG. 2, the acoustic wave filter 10 is mounted on the first major surface 41 of the mounting substrate 4. The plurality of inductors L11, L12, L13 and the plurality of capacitors C11, C12, C13, C14 (see FIG. 1) are disposed on or in the mounting substrate 4. As shown in FIG. 7A and FIG. 7B, the radio-frequency module 100 further includes a resin layer 5 and a metal electrode layer 6. The resin layer 5 is disposed on the first major surface 41 of the mounting substrate 4. The resin layer 5 covers at least part of the acoustic wave filter 10 and the inductor L11. The metal electrode layer 6 covers at least part of the resin layer 5 and at least part of an outer periphery 43 of the mounting substrate 4. Although not shown in the drawings, the metal electrode layer 6 is connected to at least one ground terminal 107. Each of the plurality of inductors L11, L12, L13 is a chip inductor disposed on the first major surface 41 of the mounting substrate 4. The plurality of capacitors C11, C12, C13, C14 is incorporated in the mounting substrate 4. In FIG. 2 to FIG. 6, the resin layer 5 and the metal electrode layer 6 are not shown.

As shown in FIG. 1, the radio-frequency module 100 according to the first embodiment further includes a third signal terminal 103, and a second filter 2 different from a first filter 1 that is the hybrid filter 1. The second filter 2 is connected between the first signal terminal 101 and the third signal terminal 103. The phrase "the second filter 2 is connected between the first signal terminal 101 and the third signal terminal 103" means that the second filter 2 is connected to both the first signal terminal 101 and the third signal terminal 103 between the first signal terminal 101 and the third signal terminal 103. The second filter 2 includes a second acoustic wave filter 20 different from a first acoustic wave filter 10 that is the acoustic wave filter 10. The second acoustic wave filter 20 is connected between the first signal terminal 101 and the third signal terminal 103. The second filter 2 further includes an inductor L20.

As shown in FIG. 2, the second acoustic wave filter 20 is mounted on the first major surface 41 of the mounting substrate 4. As shown in FIG. 3, the third signal terminal 103 is disposed on the second major surface 42 of the mounting substrate 4. The inductor L20 (see FIG. 1) is the inductance component of a wire that connects two ground electrodes 27, 28 of the second acoustic wave filter 20 to the ground terminals 107 of the mounting substrate 4.

As shown in FIG. 1, the radio-frequency module 100 further includes a fourth signal terminal 104 and a third filter 3. The third filter 3 is connected between the first signal terminal 101 and the fourth signal terminal 104. The phrase "the third filter 3 is connected between the first signal terminal 101 and the fourth signal terminal 104" means that the third filter 3 is connected to both the first signal terminal 101 and the fourth signal terminal 104 between the first signal terminal 101 and the fourth signal terminal 104. The third filter 3 includes a plurality of (for example, three) inductors L31, L32, L33 and a plurality of (for example, three) capacitors C31, C32, C33.

Figure 4:
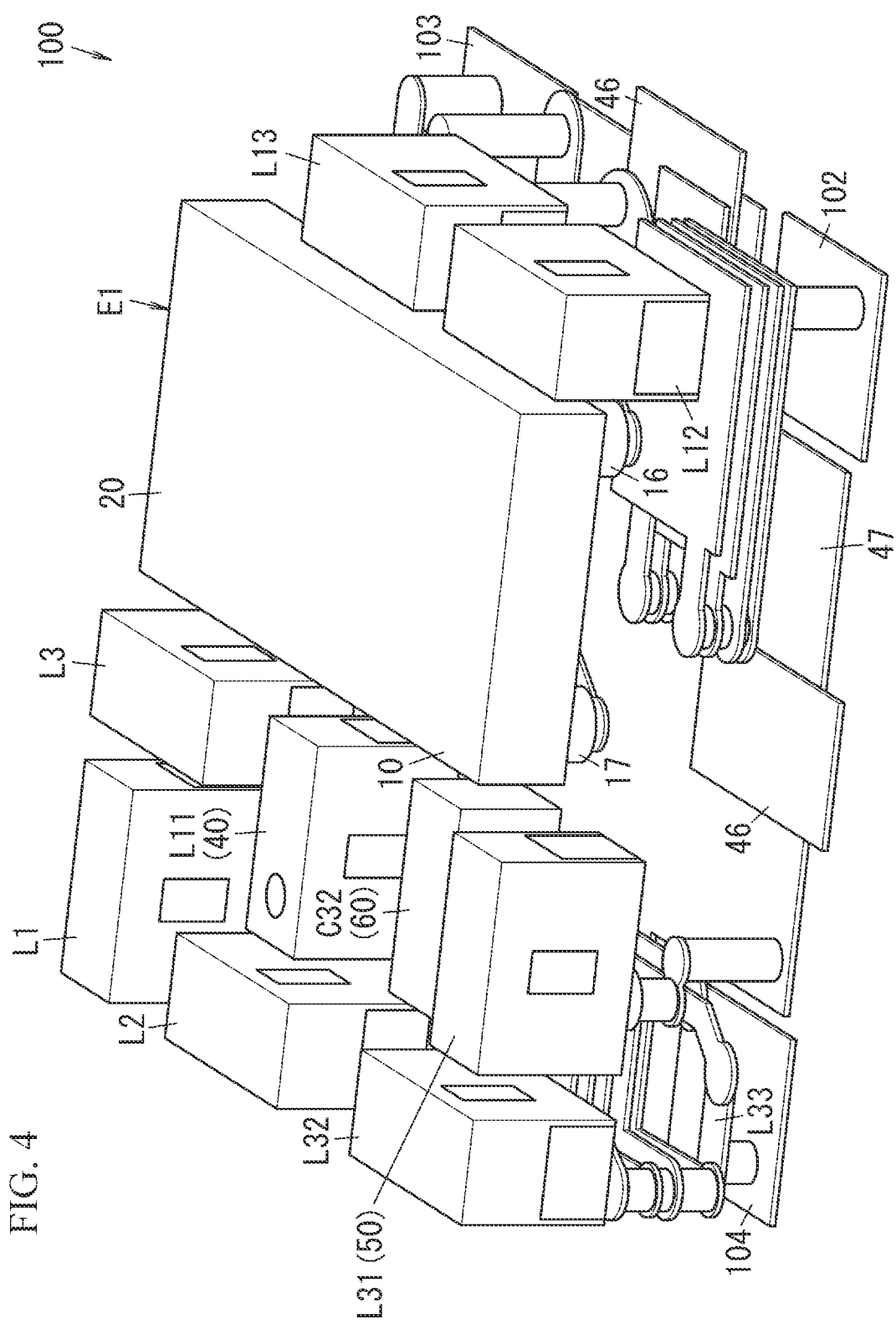
FIG. 4 shows the radio-frequency module and is a see-through perspective view of the inside of a mounting substrate.
Figure 5:
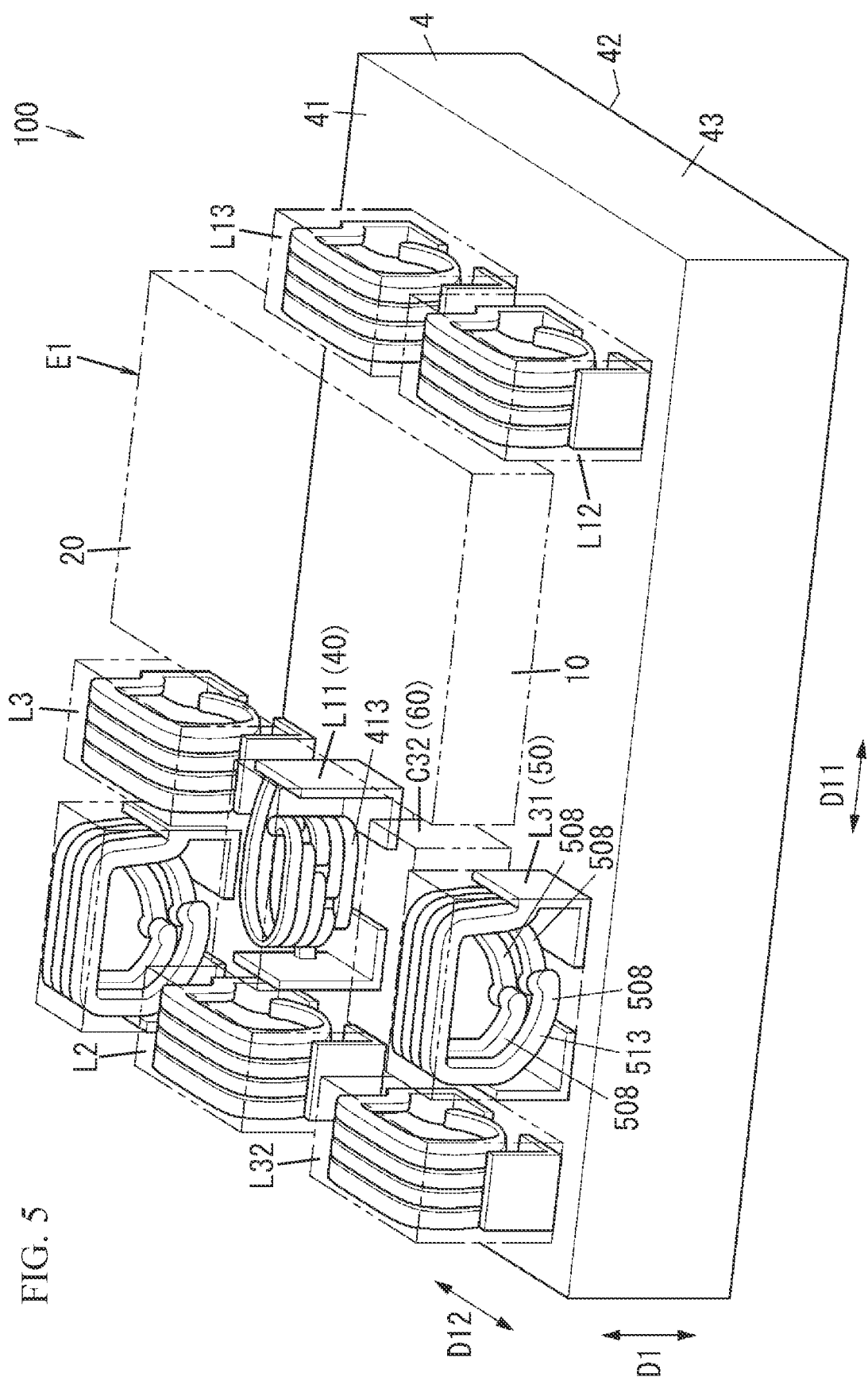
FIG. 5 shows the radio-frequency module and is a see-through perspective view of the inside of each inductor.

As shown in FIG. 2 and FIG. 3, in the radio-frequency module 100, of the three inductors L31, L32, L33, two inductors L31, L32 are mounted on the first major surface 41 of the mounting substrate 4, and the remaining one inductor L33 is an internal layer inductor disposed in the mounting substrate 4 (see FIG. 4). The fourth signal terminal 104 is disposed on the second major surface 42 of the mounting substrate 4. In the radio-frequency module 100, of the three capacitors C31, C32, C33, one capacitor C32 is mounted on the first major surface 41 of the mounting substrate 4, and the remaining two capacitors C31, C33 are incorporated in the mounting substrate 4. In the radio-frequency module 100, the inductor L31 is a second inductor 50 different from a first inductor 40 that is the inductor 40, and the capacitor C32 is a second capacitor 60 different from a first capacitor 30 that is the capacitor 30.

Figure 10:
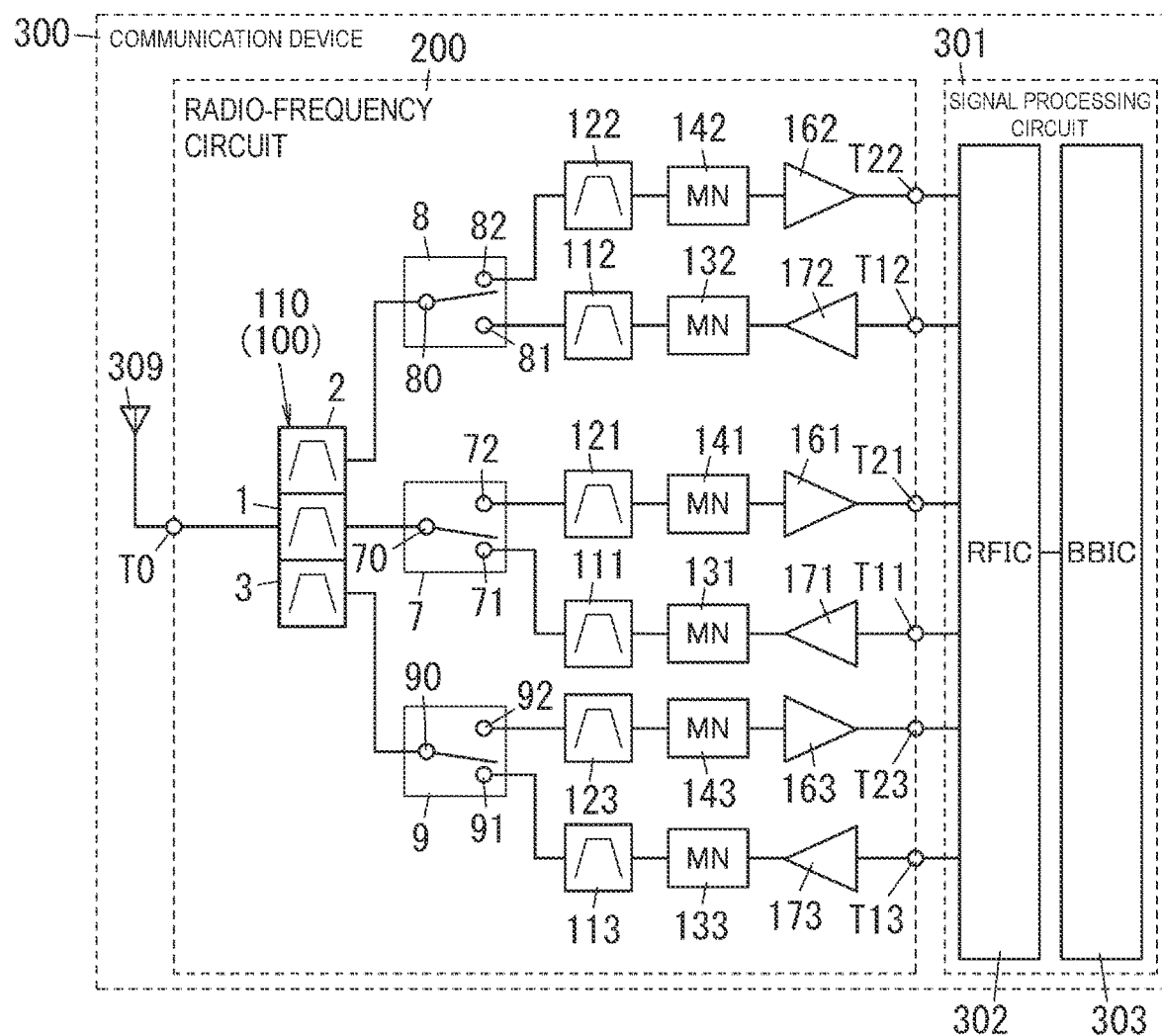
FIG. 10 is a circuit configuration diagram of a communication device that includes the radio-frequency module.

The radio-frequency module 100 is a multiplexer 110 that includes the first filter 1 (hybrid filter 1), the second filter 2, and the third filter 3 (see FIG. 10).

The radio-frequency module 100 according to the first embodiment will be described in more details after the circuit configuration of the communication device 300 and a radio-frequency circuit 200 that includes the radio-frequency module 100 is described with reference to FIG. 10.

(2) Communication Device, and Radio-Frequency Circuit Including Radio-Frequency Module (2.1) Circuit Configuration of Communication Device, and Radio-Frequency Circuit Including Radio-Frequency Module The radio-frequency circuit 200 that includes the radio-frequency module 100 is used in, for example, the communication device 300. The communication device 300 is, for example, a mobile phone (for example, a smartphone); however, the configuration is not limited thereto. The communication device 300 may be, for example, a wearable terminal (for example, a smart watch). The radio-frequency circuit 200 is, for example, a module that supports a 4G (fourth generation mobile communication) standard, a 5G (fifth generation mobile communication) standard, or the like. The 4G standard is, for example, a 3GPP (Third Generation Partnership Project) LTE (Long Term Evolution) standard. The 5G standard is, for example, 5G NR (New Radio). The radio-frequency circuit 200 may be a front-end circuit that supports carrier aggregation and dual connectivity.

The radio-frequency circuit 200 is, for example, configured to be able to amplify a transmission signal inputted from the signal processing circuit 301 and output the transmission signal to an antenna 309. The radio-frequency circuit 200 is configured to be able to amplify a reception signal inputted from the antenna 309 and output the reception signal to the signal processing circuit 301. The signal processing circuit 301 is not a component element of the radio-frequency circuit 200 but a component element of the communication device 300 that includes the radio-frequency circuit 200. The radio-frequency circuit 200 is, for example, controlled by the signal processing circuit 301 of the communication device 300. The communication device 300 includes the radio-frequency circuit 200 and the signal processing circuit 301. The communication device 300 further includes the antenna 309. The communication device 300 further includes a circuit board on or in which the radio-frequency module 100 is mounted. The circuit board is, for example, a printed circuit board. The circuit board has a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC), and performs signal processing on a radio-frequency signal. The RF signal processing circuit 302, for example, processes a signal (transmission signal) outputted from the baseband signal processing circuit 303 by up conversion or the like and outputs the processed radio-frequency signal. The RF signal processing circuit 302, for example, performs signal processing on a radio-frequency signal (reception signal) outputted from the radio-frequency circuit 200 by down conversion or the like and outputs the processed radio-frequency signal to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal, or the like inputted from the outside. The baseband signal processing circuit 303 performs IQ modulation process by synthesizing the I-phase signal with the Q-phase signal and outputs a transmission signal. At this time, the transmission signal is generated as a modulation signal (IQ signal) obtained by modulating the amplitude of a carrier wave signal with a predetermined frequency at a period longer than the period of the carrier wave signal. A reception signal processed by the baseband signal processing circuit 303 is, for example, used to display an image as an image signal or for a user of the communication device 300 to call as a voice signal. The radio-frequency circuit 200 transmits a radio-frequency signal (a reception signal or a transmission signal) between the antenna 309 and the RF signal processing circuit 302 of the signal processing circuit 301.

The radio-frequency circuit 200 includes a multiplexer 110, a plurality of (for example, three) transmission filters (a first transmission filter 111, a second transmission filter 112, and a third transmission filter 113) and a plurality of (for example, three) receiving filters (a first receiving filter 121, a second receiving filter 122, and a third receiving filter 123). The radio-frequency circuit 200 includes a first switch 7, a second switch 8, and a third switch 9. The radio-frequency circuit 200 includes a plurality of (for example, three) power amplifiers (a first power amplifier 171, a second power amplifier 172, and a third power amplifier 173) and a plurality of (for example, three) low-noise amplifiers (a first low-noise amplifier 161, a second low-noise amplifier 162, and a third low-noise amplifier 163). The radio-frequency circuit 200 includes a plurality of (for example, three) output matching circuits (a first output matching circuit 131, a second output matching circuit 132, and a third output matching circuit 133) and a plurality of (for example, three) input matching circuits (a first input matching circuit 141, a second input matching circuit 142, and a third input matching circuit 143).

The radio-frequency circuit 200 includes a plurality of external connection terminals. The plurality of external connection terminals includes an antenna terminal T0, a first signal input terminal T11, a second signal input terminal T12, a third signal input terminal T13, a first signal output terminal T21, a second signal output terminal T22, a third signal output terminal T23, and a plurality of external ground terminals. The plurality of external ground terminals is terminals electrically connected to the ground electrode of the circuit board of the communication device 300 and applied with a ground potential.

Hereinafter, the circuit configuration of the radio-frequency circuit 200 will be described in more details.

The multiplexer 110 includes the first filter 1 (hybrid filter 1), the second filter 2, the third filter 3, the first signal terminal 101, the second signal terminal 102, the third signal terminal 103, and the fourth signal terminal 104 (see FIG. 1). The first signal terminal 101 is a common terminal connected to the first filter 1, the second filter 2, and the third filter 3. The first signal terminal 101 is connected to the second signal terminal 102 via the first filter 1. The first signal terminal 101 is connected to the third signal terminal 103 via the second filter 2. The first signal terminal 101 is connected to the fourth signal terminal 104 via the third filter 3. Each of the first signal terminal 101, the second signal terminal 102, the third signal terminal 103, and the fourth signal terminal 104 is an input/output terminal used to input and output a radio-frequency signal. In the radio-frequency circuit 200, the first signal terminal 101 of the multiplexer 110 is connected to the antenna terminal T0. The antenna terminal T0 is connected to the antenna 309.

The first transmission filter 111 has a pass band including the transmission band of a first communication band. The second transmission filter 112 has a pass band including the transmission band of a second communication band. The third transmission filter 113 has a pass band including the transmission band of a third communication band. In the multiplexer 110, the first transmission filter 111 is a filter for a mid-high band. The pass band of the first transmission filter 111 is included in, for example, a frequency band of 1610 MHz to 2370 MHz and a frequency band of 2496 MHz to 2690 MHz. The second transmission filter 112 is, for example, a filter for a 2.4 GHz-band Wi-Fi (registered trademark). The transmission band of the second communication band includes, for example, 2400 MHz to 2483 MHz. The third transmission filter 113 is a filter for an ultra high band. The pass band of the third transmission filter 113 is included in, for example, a frequency band of 3300 MHz to 5000 MHz. The first communication band is, for example, 3GPP LTE standard Band 41 or 5G NR standard n41. The third communication band is, for example, 5G NR standard n79. The first transmission filter 111 is connectable to the first filter 1 of the multiplexer 110 via the first switch 7. The second transmission filter 112 is connectable to the second filter 2 of the multiplexer 110 via the second switch 8. The third transmission filter 113 is connectable to the third filter 3 of the multiplexer 110 via the third switch 9.

The first receiving filter 121 has a pass band including the receiving band of a fourth communication band. The fourth communication band is, for example, the same as the first communication band. The second receiving filter 122 has a pass band including the receiving band of a fifth communication band. The fifth communication band is, for example, the same as the second communication band. The third receiving filter 123 has a pass band including the receiving band of a sixth communication band. The sixth communication band is, for example, the same as the third communication band. The first receiving filter 121 is connectable to the first filter 1 of the multiplexer 110 via the first switch 7. The second receiving filter 122 is connectable to the second filter 2 of the multiplexer 110 via the second switch 8. The third receiving filter 123 is connectable to the third filter 3 of the multiplexer 110 via the third switch 9.

The first switch 7 has a common terminal 70 and a plurality of (for example, two) selection terminals 71, 72. In the first switch 7, the common terminal 70 is connected to the first filter 1 of the multiplexer 110. More specifically, the common terminal 70 is connected to the second signal terminal 102 (see FIG. 1) in the radio-frequency module 100 that is a component of the multiplexer 110 and is connected to the first filter 1 via the second signal terminal 102. In the first switch 7, the selection terminal 71 is connected to the first transmission filter 111, and the selection terminal 72 is connected to the first receiving filter 121. The first switch 7 is controlled by, for example, the signal processing circuit 301. In this case, the first switch 7 switches the connection status between the common terminal 70 and the plurality of selection terminals 71, 72 in accordance with a control signal from the RF signal processing circuit 302 of the signal processing circuit 301. The first switch 7 is, for example, a switch integrated circuit (IC). The first switch 7 is, for example, a switch able to connect at least one of the plurality of selection terminals 71, 72 to the common terminal 70. Here, the first switch 7 is, for example, a switch capable of one-to-one connection and one-to-multiple connection.

The second switch 8 has a common terminal 80 and a plurality of (for example, two) selection terminals 81, 82. In the second switch 8, the common terminal 80 is connected to the second filter 2 of the multiplexer 110. More specifically, the common terminal 80 is connected to the third signal terminal 103 (see FIG. 1) in the radio-frequency module 100 that is a component of the multiplexer 110 and is connected to the second filter 2 via the third signal terminal 103. In the second switch 8, the selection terminal 81 is connected to the second transmission filter 112, and the selection terminal 82 is connected to the second receiving filter 122. The second switch 8 is controlled by, for example, the signal processing circuit 301. In this case, the second switch 8 switches the connection status between the common terminal 80 and the plurality of selection terminals 81, 82 in accordance with a control signal from the RF signal processing circuit 302 of the signal processing circuit 301. The second switch 8 is, for example, a switch IC. The second switch 8 is, for example, a switch able to connect at least one of the plurality of selection terminals 81, 82 to the common terminal 80. Here, the second switch 8 is, for example, a switch capable of one-to-one connection and one-to-multiple connection.

The third switch 9 has a common terminal 90 and a plurality of (for example, two) selection terminals 91, 92. In the third switch 9, the common terminal 90 is connected to the third filter 3 of the multiplexer 110. More specifically, the common terminal 90 is connected to the fourth signal terminal 104 (see FIG. 1) in the radio-frequency module 100 that is a component of the multiplexer 110 and is connected to the third filter 3 via the fourth signal terminal 104. In the third switch 9, the selection terminal 91 is connected to the third transmission filter 113, and the selection terminal 92 is connected to the third receiving filter 123. The third switch 9 is controlled by, for example, the signal processing circuit 301. In this case, the third switch 9 switches the connection status between the common terminal 90 and the plurality of selection terminals 91, 92 in accordance with a control signal from the RF signal processing circuit 302 of the signal processing circuit 301. The third switch 9 is, for example, a switch IC. The third switch 9 is, for example, a switch able to connect at least one of the plurality of selection terminals 91, 92 to the common terminal 90. Here, the third switch 9 is, for example, a switch capable of one-to-one connection and one-to-multiple connection.

The first power amplifier 171 has an input terminal and an output terminal. The first power amplifier 171 amplifies a transmission signal inputted to the input terminal of the first power amplifier 171 and outputs the transmission signal from the output terminal of the first power amplifier 171. The input terminal of the first power amplifier 171 is connected to the first signal input terminal T11. The input terminal of the first power amplifier 171 is connected to the signal processing circuit 301 via the first signal input terminal T11. The output terminal of the first power amplifier 171 is connected to the first transmission filter 111 via the first output matching circuit 131. The first power amplifier 171 is a power amplifier capable of amplifying a radio-frequency signal in the pass band of the first transmission filter 111. The first output matching circuit 131 is a circuit for matching the impedance between the first power amplifier 171 and the first transmission filter 111 and includes, for example, a plurality of inductors and a plurality of capacitors.

The second power amplifier 172 has an input terminal and an output terminal. The second power amplifier 172 amplifies a transmission signal inputted to the input terminal of the second power amplifier 172 and outputs the transmission signal from the output terminal of the second power amplifier 172. The input terminal of the second power amplifier 172 is connected to the second signal input terminal T12. The input terminal of the second power amplifier 172 is connected to the signal processing circuit 301 via the second signal input terminal T12. The output terminal of the second power amplifier 172 is connected to the second transmission filter 112 via the second output matching circuit 132. The second power amplifier 172 is a power amplifier capable of amplifying a radio-frequency signal in the pass band of the second transmission filter 112. The second output matching circuit 132 is a circuit for matching the impedance between the second power amplifier 172 and the second transmission filter 112 and includes, for example, a plurality of inductors and a plurality of capacitors.

The third power amplifier 173 has an input terminal and an output terminal. The third power amplifier 173 amplifies a transmission signal inputted to the input terminal of the third power amplifier 173 and outputs the transmission signal from the output terminal of the third power amplifier 173. The input terminal of the third power amplifier 173 is connected to the third signal input terminal T13. The input terminal of the third power amplifier 173 is connected to the signal processing circuit 301 via the third signal input terminal T13. The output terminal of the third power amplifier 173 is connected to the third transmission filter 113 via the third output matching circuit 133. The third power amplifier 173 is a power amplifier capable of amplifying a radio-frequency signal in the pass band of the third transmission filter 113. The third output matching circuit 133 is a circuit for matching the impedance between the third power amplifier 173 ad the third transmission filter 113 and includes, for example, a plurality of inductors and a plurality of capacitors.

The radio-frequency circuit 200 may further include a controller. The controller controls, for example, the first power amplifier 171, the second power amplifier 172, and the third power amplifier 173 in accordance with a control signal from the signal processing circuit 301.

The first low-noise amplifier 161 has an input terminal and an output terminal. The first low-noise amplifier 161 amplifies a reception signal inputted to the input terminal of the first low-noise amplifier 161 and outputs the reception signal from the output terminal of the first low-noise amplifier 161. The input terminal of the first low-noise amplifier 161 is connected to the first receiving filter 121 via the first input matching circuit 141. The first input matching circuit 141 is a circuit for matching the impedance between the first low-noise amplifier 161 and the first receiving filter 121. The first input matching circuit 141 includes, for example, an inductor. The output terminal of the first low-noise amplifier 161 is connected to the first signal output terminal T21. The output terminal of the first low-noise amplifier 161 is, for example, connected to the signal processing circuit 301 via the first signal output terminal T21.

The second low-noise amplifier 162 has an input terminal and an output terminal. The second low-noise amplifier 162 amplifies a reception signal inputted to the input terminal of the second low-noise amplifier 162 and outputs the reception signal from the output terminal of the second low-noise amplifier 162. The input terminal of the second low-noise amplifier 162 is connected to the second receiving filter 122 via the second input matching circuit 142. The second input matching circuit 142 is a circuit for matching the impedance between the second low-noise amplifier 162 and the second receiving filter 122. The second input matching circuit 142 includes, for example, an inductor. The output terminal of the second low-noise amplifier 162 is, for example, connected to the signal processing circuit 301 via the second signal output terminal T22.

The third low-noise amplifier 163 has an input terminal and an output terminal. The third low-noise amplifier 163 amplifies a reception signal inputted to the input terminal of the third low-noise amplifier 163 and outputs the reception signal from the output terminal of the third low-noise amplifier 163. The input terminal of the third low-noise amplifier 163 is connected to the third receiving filter 123 via the third input matching circuit 143. The third input matching circuit 143 is a circuit for matching the impedance between the third low-noise amplifier 163 and the third receiving filter 123. The third input matching circuit 143 includes, for example, an inductor. The output terminal of the third low-noise amplifier 163 is, for example, connected to the signal processing circuit 301 via the third signal output terminal T23.

(2.2) Circuit Configuration of Radio-Frequency Module

As shown in FIG. 1, the radio-frequency module 100 includes the first signal terminal 101, the second signal terminal 102, the third signal terminal 103, the fourth signal terminal 104, the hybrid filter 1 (first filter 1), the second filter 2, and the third filter 3.

The hybrid filter 1 further includes the first acoustic wave filter 10, the plurality of (for example, three) inductors L11, L12, L13 and the plurality of (for example, four) capacitors C11, C12, C13, C14. The first acoustic wave filter 10 includes at least one (for example, three) acoustic wave resonator 14. The first acoustic wave filter 10 is, for example, a surface acoustic wave filter that uses surface acoustic waves. In this case, each of the plurality of acoustic wave resonators 14 is a surface acoustic wave (SAW) resonator.

The first acoustic wave filter 10 is, for example, a π filter. The first acoustic wave filter 10 includes the three acoustic wave resonators 14, the first input and output electrode 15 connected to the first signal terminal 101, the second input and output electrode 16 connected to the second signal terminal 102, and the two ground electrodes 17, 18. The three acoustic wave resonators 14 include one series arm resonator S11 and two parallel arm resonators P11, P12.

The series arm resonator S11 is provided in a path 150 (hereinafter, also referred to as series arm path 150) between the first input and output electrode 15 and the second input and output electrode 16. The series arm resonator S11 is connected between the first signal terminal 101 and the second signal terminal 102.

The parallel arm resonator P11 is provided in a path 151 (parallel arm path 151) between the ground electrode 17 and a path between the first input and output electrode 15 and the series arm resonator S11 in the series arm path 150. The parallel arm resonator P12 is provided in a path 152 (parallel arm path 152) between the ground electrode 18 and a path between the series arm resonator S11 and the second input and output electrode 16 in the series arm path 150.

The inductor L11 is connected between the first signal terminal 101 and the first acoustic wave filter 10. Here, the inductor L11 is connected in series with the first acoustic wave filter 10. More specifically, in the inductor L11, one end (a first contact 411 shown in FIG. 7A and FIG. 7B) of the inductor L11 is connected to the first signal terminal 101, and the other end (a second contact 412 shown in FIG. 7A and FIG. 7B) of the inductor L11 is connected to the first input and output electrode 15 of the first acoustic wave filter 10. Thus, the inductor L11 is connected in series with the series arm resonator S11 of the first acoustic wave filter 10.

The capacitor C11 is connected in parallel with the inductor L11. A parallel circuit made up of the capacitor C11 and the inductor L11 also has the function of a phase-shift circuit.

The inductor L12 is connected between the first acoustic wave filter 10 and the second signal terminal 102. Here, the inductor L12 is connected in series with the first acoustic wave filter 10. More specifically, in the inductor L12, one end of the inductor L12 is connected to the second input and output electrode 16 of the first acoustic wave filter 10, and the other end of the inductor L12 is connected to the second signal terminal 102. Thus, the inductor L12 is connected in series with the series arm resonator S11 of the first acoustic wave filter 10. The inductor L12 is an inductor closest to the second signal terminal 102 in a signal path between the first signal terminal 101 and the second signal terminal 102.

In the inductor L13, one end of the inductor L13 is connected to a path between the inductor L12 and the second signal terminal 102, and the other end of the inductor L13 is connected to the ground (ground terminal 107) of the radio-frequency module 100. In the hybrid filter 1, an LC circuit connected between the first acoustic wave filter 10 and the second signal terminal 102 has a function to define a pass band in the hybrid filter 1. The LC circuit includes the inductor L12, the inductor L13, the capacitor C12, the capacitor C13, and the capacitor C14.

The capacitor C12 is connected between the ground terminal 107 and a path between the second input and output electrode 16 and the inductor L12 in the first acoustic wave filter 10.

The capacitor C13 is connected between the inductor L12 and the second signal terminal 102. The capacitor C13 is connected in series with the inductor L12.

The capacitor C14 is connected in series with the inductor L13. More specifically, the capacitor C14 is connected between the inductor L13 and the ground terminal 107 of the radio-frequency module 100.

The second filter 2 is connected between the first signal terminal 101 and the third signal terminal 103. The second filter 2 includes the second acoustic wave filter 20 and the inductor L20. The second acoustic wave filter 20 includes at least one (for example, 10) acoustic wave resonator 24. The second acoustic wave filter 20 is, for example, a surface acoustic wave filter that uses surface acoustic waves. In this case, each of the plurality of acoustic wave resonators 24 is a surface acoustic wave (SAW) resonator.

The second acoustic wave filter 20 is, for example, a ladder filter. The second acoustic wave filter 20 includes the 10 acoustic wave resonators 24, the first input and output electrode 25 connected to the first signal terminal 101, the second input and output electrode 26 connected to the third signal terminal 103, and the two ground electrodes 27, 28. The 10 acoustic wave resonators 24 include five series arm resonators S21, S22, S23, S24, S25 and five parallel arm resonators P21, P22, P23, P24, P25.

The five series arm resonators S21, S22, S23, S24, S25 are provided in a path 250 (hereinafter, also referred to as series arm path 250) between the first input and output electrode 25 and the second input and output electrode 26. The five series arm resonators S21, S22, S23, S24, S25 are connected in series in the series arm path 250. In the second acoustic wave filter 20, the five series arm resonators S21, S22, S23, S24, S25 are arranged in the series arm path 250 in order of the series arm resonator S21, the series arm resonator S22, the series arm resonator S23, the series arm resonator S24, and the series arm resonator S25 from the first input and output electrode 25 side.

The parallel arm resonator P21 is provided in a path 251 (parallel arm path 251) between the ground electrode 27 and a path between the first input and output electrode 25 and the series arm resonator S21 in the series arm path 250. The parallel arm resonator P22 is provided in a path 252 (parallel arm path 252) between the ground electrode 27 and a path between the series arm resonator S21 and the series arm resonator S22 in the series arm path 250. The parallel arm resonator P23 is provided in a path 253 (parallel arm path 253) between the ground electrode 27 and a path between the series arm resonator S22 and the series arm resonator S23 in the series arm path 250. The parallel arm resonator P24 is provided in a path 254 (parallel arm path 254) between the ground electrode 28 and a path between the series arm resonator S23 and the series arm resonator S24 in the series arm path 250. The parallel arm resonator P25 is provided in a path 255 (parallel arm path 255) between the ground electrode 28 and a path between the series arm resonator S25 and the second input and output electrode 26 in the series arm path 250.

The inductor L20 is the inductance component of a wire that connects the two ground electrodes 27, 28 of the second acoustic wave filter 20 to the ground terminal 107.

The radio-frequency module 100 further includes a capacitor C22. The capacitor C22 is the capacitance component of a wire that connects a path between the second acoustic wave filter 20 and the third signal terminal 103 to the ground terminal 107.

The radio-frequency module 100 further includes the inductor L1, the inductor L2, the inductor L3, and the capacitor C2. The inductor L1 is connected between the first signal terminal 101 and both the first filter 1 and the second filter 2. The inductor L1 has, for example, a function to match impedance between the first signal terminal 101 and both the first filter 1 and the second filter 2. A series circuit made up of the inductor L2 and the capacitor C2 is connected between a ground and a common path Ru0 of a first path Ru1 between the first filter 1 and the first signal terminal 101 and a second path Ru2 between the second filter 2 and the first signal terminal 101. More specifically, a series circuit made up of the inductor L2 and the capacitor C2 is connected between the ground and a path between the inductor L1 and a junction point between the first filter 1 and the second filter 2. A series circuit made up of the inductor L2 and the capacitor C2 has a function to attenuate harmonics in the pass band of the first filter 1 and harmonics in the pass band of the second filter 2. The inductor L3 is connected between the common path Ru0 and the ground. More specifically, the inductor L3 is connected in parallel with a series circuit made up of the inductor L2 and the capacitor C2. The inductor L3 is an inductor for measures against electro-static discharge (ESD). The inductor L1, the inductor L2, the inductor L3, and the capacitor C3 may function as an impedance matching circuit between the first signal terminal 101 and both the first path Ru1 and the second path Ru2 as an overall circuit.

The radio-frequency module 100 further includes the capacitor C21 connected between the first signal terminal 101 and the second filter 2.

The third filter 3 is an LC filter. The third filter 3 includes the plurality of (for example, three) inductors L31, L32, L33 and the plurality of (for example, three) capacitors C31, C32, C33.

In the third filter 3, a series circuit made up of the capacitor C31, the capacitor C33, and the inductor L32 is connected between the first signal terminal 101 and the fourth signal terminal 104. Here, in the capacitor C31, one end of the capacitor C31 is connected to the first signal terminal 101, and the other end of the capacitor C31 is connected to one end of the capacitor C33. In the capacitor C33, the other end of the capacitor C33 is connected to one end of the inductor L32. In the inductor L32, the other end of the inductor L32 is connected to the fourth signal terminal 104.

In the third filter 3, a series circuit made up of the capacitor C32 and the inductor L31 is connected between the ground terminal 107 of the radio-frequency module 100 and a path between the capacitor C31 and the capacitor C33. Here, in the capacitor C32, one end of the capacitor C32 is connected to a path between the capacitor C31 and the capacitor C33, and the other end of the capacitor C32 is connected to one end of the inductor L31. In the inductor L31, the other end of the inductor L31 is connected to the ground terminal 107 of the radio-frequency module 100.

(2.3) Structure of Radio-Frequency Module

Hereinafter, the structure of the radio-frequency module 100 will be described with reference to FIG. 2 to FIG. 10.

As shown in FIG. 2 and FIG. 3, the radio-frequency module 100 includes the mounting substrate 4, the first signal terminal 101, the second signal terminal 102, the third signal terminal 103, the fourth signal terminal 104, and the plurality of ground terminals 107. The radio-frequency module 100 includes the first acoustic wave filter 10, the inductor L11, and the capacitor C11. The radio-frequency module 100 further includes the plurality of (for example, two) inductors L12, L13 and the plurality of (for example, three) capacitors C12, C13, C14. The radio-frequency module 100 further includes the second acoustic wave filter 20, the inductor L20, the capacitor C21, and the capacitor C22 (see FIG. 1). In the present embodiment, the first acoustic wave filter 10 and the second acoustic wave filter 20 each have such a structure that functional elements are formed on or in the same substrate. The radio-frequency module 100 further includes the inductor L1, the inductor L2, the inductor L3, and the capacitor C2. The radio-frequency module 100 further includes the plurality of (for example, two) inductors L31, L32 and the plurality of (for example, three) capacitors C31, C32, C33. As shown in FIG. 7A and FIG. 7B, the radio-frequency module 100 further includes the resin layer 5 and the metal electrode layer 6.

The mounting substrate 4 has the first major surface 41 and the second major surface 42 facing each other in the thickness direction D1 of the mounting substrate 4. The mounting substrate 4 is, for example, a multilayer substrate that includes a plurality of dielectric layers and a plurality of electrically conductive layers. The plurality of dielectric layers and the plurality of electrically conductive layers are laminated in the thickness direction D1 of the mounting substrate 4. The plurality of electrically conductive layers each is formed in a predetermined pattern determined layer by layer. Each of the plurality of electrically conductive layers includes one or more conductor portions in a plane orthogonal to the thickness direction D1 of the mounting substrate 4. The material of each electrically conductive layer is, for example, copper. The plurality of electrically conductive layers includes a plurality of first ground conductor portions 46 and a second ground conductor portion 47 (see FIG. 4). In the radio-frequency module 100, the ground terminal 107 and each of the plurality of first ground conductor portions 46 and the second ground conductor portion 47 are electrically connected via a via conductor and the like of the mounting substrate 4. The mounting substrate 4 is, for example, a low temperature co-fired ceramics (LTCC) substrate. The mounting substrate 4 is not limited to an LTCC substrate. The mounting substrate 4 may be, for example, a printed circuit board, a high temperature co-fired ceramics (HTCC) substrate, or a resin multilayer substrate. In plan view in the thickness direction D1 of the mounting substrate 4, an outer edge 431 of the first major surface 41 of the mounting substrate 4 and an outer edge 432 of the second major surface 42 (see FIG. 3) each have, for example, a rectangular shape. Hereinafter, when the radio-frequency module 100 is described, the description can be made by using a first direction D11 and a second direction D12 orthogonal to the thickness direction D1 of the mounting substrate 4. The first direction D11 and the second direction D12 are orthogonal to each other. The first direction D11 is, for example, a direction along a first side (long side) of the outer edge 431 of the first major surface 41 in plan view in the thickness direction D1 of the mounting substrate 4. The second direction D12 is, for example, a direction along a second side (short side) of the outer edge 431 of the first major surface 41 of the mounting substrate 4 in plan view in the thickness direction D1 of the mounting substrate 4.

The mounting substrate 4 is not limited to an LTCC substrate and may be, for example, a wiring structure. The wiring structure is, for example, a multilayer structure. The multilayer structure includes at least one electrically insulating layer and at least one electrically conductive layer. The electrically insulating layer is formed in a predetermined pattern. When the number of the electrically insulating layers is multiple, each of the multiple electrically insulating layers is formed in a predetermined pattern determined layer by layer. The electrically conductive layer is formed in a predetermined pattern different from the predetermined pattern of the electrically insulating layer. When the number of the electrically conductive layers is multiple, each of the multiple electrically conductive layers is formed in a predetermined pattern determined layer by layer. The electrically conductive layer may include one or more rewiring portions. In the wiring structure, of two surfaces facing each other in the thickness direction of the multilayer structure, a first surface is the first major surface 41 of the mounting substrate 4, and a second surface is the second major surface 42 of the mounting substrate 4. The wiring structure may be, for example, an interposer. The interposer may be an interposer using a silicon substrate or may be a substrate made up of multiple layers.

The first major surface 41 and the second major surface 42 of the mounting substrate 4 are spaced apart in the thickness direction D1 of the mounting substrate 4 and intersect with the thickness direction D1 of the mounting substrate 4. The first major surface 41 of the mounting substrate 4 is, for example, orthogonal to the thickness direction D1 of the mounting substrate 4. The first major surface 41 may include, for example, the side surface or the like of the conductor portion as a surface not orthogonal to the thickness direction D1. The second major surface 42 of the mounting substrate 4 is, for example, orthogonal to the thickness direction D1 of the mounting substrate 4. The second major surface 42 may include, for example, the side surface or the like of the conductor portion as a surface not orthogonal to the thickness direction D1. The first major surface 41 and the second major surface 42 of the mounting substrate 4 may have minute irregularities or a recessed portion or a protruding portion.

The plurality of external connection terminals of the radio-frequency module 100 is disposed on the second major surface 42 of the mounting substrate 4. The phrase "the external connection terminals are disposed on the second major surface 42 of the mounting substrate 4" includes not only the structure that the external connection terminals are mechanically connected to the second major surface 42 of the mounting substrate 4 but also the structure that the external connection terminals are electrically connected to (appropriate conductor portions of) the mounting substrate 4. The plurality of external connection terminals includes the first signal terminal 101, the second signal terminal 102, the third signal terminal 103, the fourth signal terminal 104, and the plurality of ground terminals 107. The plurality of ground terminals 107 is electrically connected to the plurality of first ground conductor portions 46 and the second ground conductor portion 47 of the mounting substrate 4. The plurality of first ground conductor portions 46 and the second ground conductor portion 47 each are a circuit ground of the radio-frequency module 100. In plan view in the thickness direction D1 of the mounting substrate 4, each of the first signal terminal 101, the second signal terminal 102, the third signal terminal 103, and the plurality of ground terminals 107 has a quadrangular shape. The thickness of each of the first signal terminal 101, the second signal terminal 102, the third signal terminal 103, the fourth signal terminal 104, and the plurality of ground terminals 107 is thinner than the thickness of the mounting substrate 4. The material of the plurality of external connection terminals is, for example, metal (for example, copper, copper alloy, or the like).

As shown in FIG. 2, in the radio-frequency module 100, an electronic component E1 that includes the first acoustic wave filter 10 and the second acoustic wave filter 20 is mounted on the first major surface 41 of the mounting substrate 4. The phrase "the electronic component E1 is mounted on the major surface 41 of the mounting substrate 4" includes not only a structure that the electronic component E1 is disposed on (mechanically connected to) the first major surface 41 of the mounting substrate 4 but also a structure that the electronic component E1 is electrically connected to (appropriate conductor portions of) the mounting substrate 4. In the radio-frequency module 100, the first input and output electrode 15, the second input and output electrode 16, and the two ground electrodes 17, 18 of the first acoustic wave filter 10 are connected to the first major surface 41 of the mounting substrate 4. In the radio-frequency module 100, the first input and output electrode 25, the second input and output electrode 26, and the two ground electrodes 27, 28 of the second acoustic wave filter 20 are connected to the first major surface 41 of the mounting substrate 4. Each of the first input and output electrode 15, the second input and output electrode 16, and the two ground electrodes 17, 18 of the first acoustic wave filter 10 includes an electrically conductive bump. Each of the first input and output electrode 25, the second input and output electrode 26, and the two ground electrodes 27, 28 of the second acoustic wave filter 20 includes an electrically conductive bump. The material of the electrically conductive bumps is, for example, solder, gold, or copper.

Figure 8A:
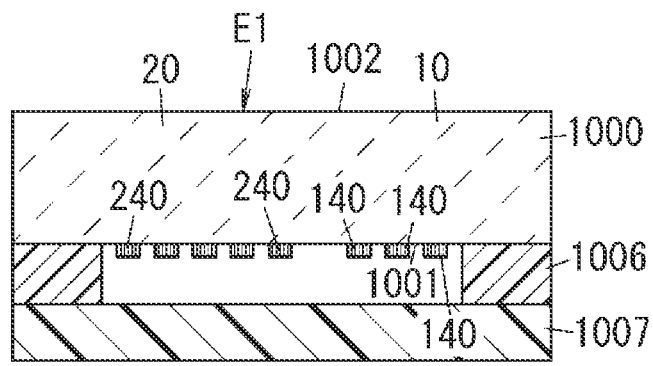
FIG. 8A is a cross-sectional view of an electronic component in the radio-frequency module, taken along the line Y1-Y1 in FIG. 2.
Figure 8B:
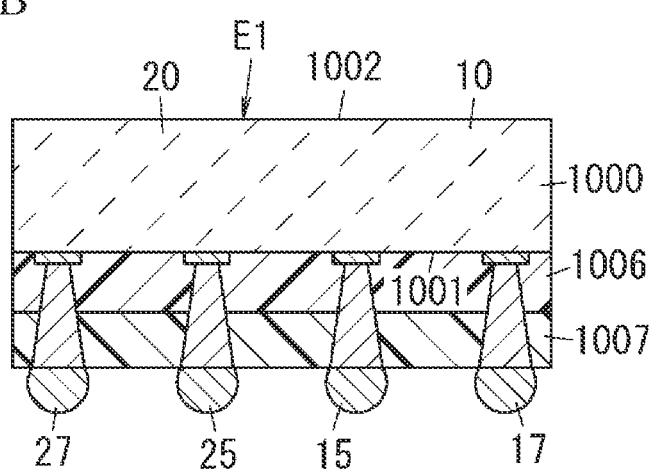
FIG. 8B is a cross-sectional view of the electronic component in the radio-frequency module, taken along the line Y2-Y2 in FIG. 2.
Figure 8C:
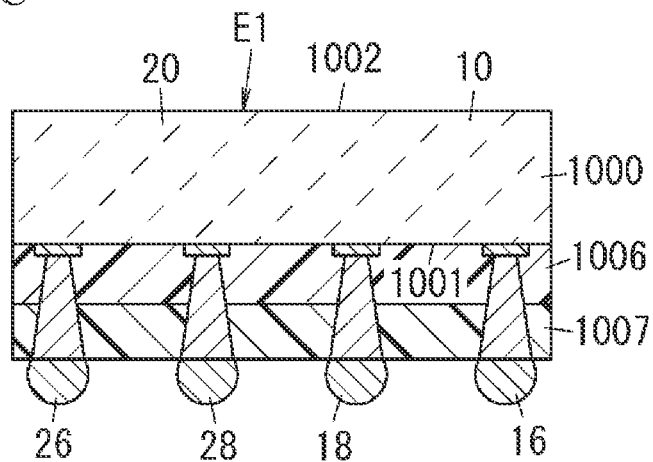
FIG. 8C is a cross-sectional view of the electronic component in the radio-frequency module, taken along the line Y3-Y3 in FIG. 2.

As shown in FIG. 8A to FIG. 8C, the electronic component E1 includes, for example, the first acoustic wave filter 10 and the second acoustic wave filter 20. The first acoustic wave filter 10 includes a first substrate (substrate 1000). The second acoustic wave filter 20 includes a second substrate (substrate 1000). In the electronic component E1, the first substrate and the second substrate are the same. In other words, in the electronic component E1, the first substrate and the second substrate are the same substrate 1000. In plan view in the thickness direction D1 of the mounting substrate 4, the outer edge of the substrate 1000 has a rectangular shape. In the electronic component E1, in the long-side direction of the substrate 1000, the first acoustic wave filter 10 and the second acoustic wave filter 20 are arranged. In plan view in the thickness direction D1 of the mounting substrate 4, the outer edge of the electronic component E1 has the same rectangular shape as the outer edge of the substrate 1000. The substrate 1000 has a first major surface 1001 and a second major surface 1002 facing each other in the thickness direction of the substrate 1000 (a direction along the thickness direction D1 of the mounting substrate 4). Hereinafter, the phrase "on the substrate 1000" means "on the first major surface 1001 of the substrate 1000".

As described above, the first acoustic wave filter 10 is, for example, a π filter that includes the plurality of (three) acoustic wave resonators 14 (see FIG. 1).

The first substrate (substrate 1000) is a piezoelectric substrate and is, for example, a lithium tantalate substrate or a lithium niobate substrate. The first acoustic wave filter 10 includes a plurality of (three) first interdigital transducer (IDT) electrodes 140 provided on the first substrate (substrate 1000). The plurality of first IDT electrodes 140 has an electrical conductivity. Examples of the material of the plurality of first IDT electrodes 140 include aluminum (Al), copper (Cu), platinum (Pt), gold (Au), silver (Ag), titanium (Ti), nickel (Ni), chromium (Cr), molybdenum (Mo), tungsten (W), tantalum (Ta), magnesium (Mg), iron (Fe), and alloys containing any one of these metals as a main ingredient. The plurality of first IDT electrodes 140 may have a structure such that a plurality of metal films made of any one of these metals or alloys is laminated. The plurality of first IDT electrodes 140 includes, for example, a laminated film of a first metal film made from a Ti film formed on the substrate 1000 and a second metal film made of an Al film formed on the first metal film. The first metal film has the function of an adhesion film. The material of the first metal film is Ti; however, the configuration is not limited thereto. The material of the first metal film may be, for example, Cr or NiCr. The material of the second metal film is Al; however, the configuration is not limited thereto. The material of the second metal film may include, for example, Al and Cu. The thickness of the first metal film is thinner than the thickness of the second metal film. In the first acoustic wave filter 10, each of the plurality of first IDT electrodes 140 is a component element of an SAW resonator. In the first acoustic wave filter 10, a plurality of first wiring portions that connect the plurality of first IDT electrodes 140 is provided on the first substrate (substrate 1000). In the first acoustic wave filter 10, the series arm path 150, the parallel arm path 151, and the parallel arm path 152 (see FIG. 1) are made up of the plurality of first wiring portions. In the first acoustic wave filter 10, the plurality of acoustic wave resonators 14 is connected by connecting the plurality of first IDT electrodes 140. In the first acoustic wave filter 10, the first input and output electrode 15, the second input and output electrode 16, and the two ground electrodes 17, 18 are provided on the first substrate (substrate 1000).

As described above, the second acoustic wave filter 20 is, for example, a ladder filter that includes a plurality of (10) acoustic wave resonators 24 (see FIG. 1).

The second acoustic wave filter 20 includes a plurality of (10) of second IDT electrodes 240 provided on the second substrate (substrate 1000). The material of the plurality of second IDT electrodes 240 is the same as the material of the plurality of first IDT electrodes 140. In the second acoustic wave filter 20, each of the plurality of second IDT electrodes 240 is a component element of an SAW resonator. In the second acoustic wave filter 20, a plurality of second wiring portions that connect the plurality of second IDT electrodes 240 is provided on the second substrate (substrate 1000). In the second acoustic wave filter 20, the series arm path 250 and the five parallel arm paths 251 to 255 (see FIG. 1) are made up of the plurality of second wiring portions. In the second acoustic wave filter 20, the plurality of acoustic wave resonators 24 is connected by connecting the plurality of second IDT electrodes 240. In the second acoustic wave filter 20, the first input and output electrode 25, the second input and output electrode 26, and the two ground electrodes 27, 28 are provided on the second substrate (substrate 1000). Each of the first input and output electrode 25, the second input and output electrode 26, and the two ground electrodes 27, 28 of the second acoustic wave filter 20 includes an electrically conductive bump.

The first acoustic wave filter 10 is disposed on the first major surface 41 of the mounting substrate 4 such that the plurality of first IDT electrodes 140 is located on the mounting substrate 4 side when viewed from the first substrate. The second acoustic wave filter 20 is disposed on the first major surface 41 of the mounting substrate 4 such that the plurality of second IDT electrodes 240 is located on the mounting substrate 4 side when viewed from the second substrate.

The first acoustic wave filter 10 further includes component elements of a first package. The component elements of the first package include, for example, a first spacer layer (spacer layer 1006), a first cover member (cover member 1007), a plurality of first outer electrodes (the first input and output electrode 15, the second input and output electrode 16, and the two ground electrodes 17, 18) that are the plurality of outer electrodes. The first spacer layer is provided on the first substrate. In plan view in the thickness direction of the first substrate, the first spacer layer includes a part formed along the outer edge of the first substrate. The first spacer layer has electrical insulating properties. The material of the first spacer layer is, for example, epoxy resin, polyimide, or the like. The first cover member has a flat shape. The first cover member is disposed on the first spacer layer so as to face the first substrate in the thickness direction of the first substrate. The first cover member overlaps the plurality of first IDT electrodes 140 in the thickness direction of the first substrate and is spaced apart from the plurality of first IDT electrodes 140 in the thickness direction of the first substrate. The first cover member has electrical insulating properties. The material of the first cover member is, for example, epoxy resin, polyimide, or the like. Each of the first input and output electrode 15, the second input and output electrode 16, and the two ground electrodes 17, 18 is exposed from the first cover member.

The second acoustic wave filter 20 further includes component elements of a second package. The component elements of the second package include, for example, a second spacer layer (spacer layer 1006), a second cover member (cover member 1007), a plurality of second outer electrodes (the first input and output electrode 25, the second input and output electrode 26, and the two ground electrodes 27, 28). The second spacer layer is provided on the second substrate. In plan view in the thickness direction of the second substrate, the second spacer layer includes a part formed along the outer edge of the second substrate. The second spacer layer has electrical insulating properties. The material of the second spacer layer is, for example, epoxy resin, polyimide, or the like. The second cover member has a flat shape. The second cover member is disposed on the second spacer layer so as to face the second substrate in the thickness direction of the second substrate. The second cover member overlaps the plurality of second IDT electrodes 240 in the thickness direction of the second substrate and is spaced apart from the plurality of second IDT electrodes 240 in the thickness direction of the second substrate. The second cover member has electrical insulating properties. The material of the second cover member is, for example, epoxy resin, polyimide, or the like. Each of the first input and output electrode 25, the second input and output electrode 26, and the two ground electrodes 27, 28 is exposed from the second cover member.

In the electronic component E1, the first spacer layer and the second spacer layer are the same. In other words, in the electronic component E1, the first spacer layer and the second spacer layer are the same spacer layer 1006. In the electronic component E1, the first cover member and the second cover member are the same cover member 1007.

The first substrate and the second substrate are not limited to a piezoelectric substrate. The first substrate and the second substrate may be, for example, a multilayer substrate that includes a silicon substrate, a low acoustic velocity film provided on the silicon substrate, and a piezoelectric layer provided on the low acoustic velocity film. The material of the piezoelectric layer is, for example, lithium tantalate or lithium niobate. The low acoustic velocity film is a film through which a bulk wave propagates at an acoustic velocity lower than an acoustic velocity at which a bulk wave propagates through the piezoelectric layer. The material of the low acoustic velocity film is, for example, silicon oxide. The material of the low acoustic velocity film is not limited to silicon oxide. The material of the low acoustic velocity film may be, for example, silicon oxide, glass, silicon oxynitride, tantalum oxide, a chemical compound obtained by adding fluorine, carbon, or boron to silicon oxide, or a material containing at least one of the above materials as a main ingredient. In the silicon substrate, a bulk wave propagates through the silicon substrate at an acoustic velocity higher than an acoustic velocity at which an acoustic wave propagates through the piezoelectric layer. Here, a bulk wave that propagates through the silicon substrate is a bulk wave that propagates through the silicon substrate at the lowest velocity of a plurality of bulk waves.

The multilayer substrate may further include a high acoustic velocity film provided between the silicon substrate and the low acoustic velocity film. The high acoustic velocity film is a film through which a bulk wave propagates at an acoustic velocity higher than an acoustic velocity at which an acoustic wave propagates through the piezoelectric layer. The material of the high acoustic velocity film is, for example, at least one material selected from a group consisting of diamond like carbon, aluminum nitride, aluminum oxide, silicon carbide, silicon nitride, silicon, sapphire, a piezoelectric body (lithium tantalate, lithium niobate, or quartz crystal), alumina, zirconia, cordierite, mullite, steatite, forsterite, magnesia, and diamond. The material of the high acoustic velocity film may be a material containing any one of the above-described materials as a main ingredient or a material containing a mixture including any one of the above-described materials as a main ingredient.

The multilayer substrate may contain, for example, an adhesion layer interposed between the low acoustic velocity film and the piezoelectric layer. The adhesion layer is made of, for example, a resin (epoxy resin or polyimide resin). The multilayer substrate may include a dielectric film between the low acoustic velocity film and the piezoelectric layer, on or above the piezoelectric layer, or on or below the low acoustic velocity film.

In the radio-frequency module 100, the plurality of circuit elements is disposed on or in the mounting substrate 4. The plurality of circuit elements includes a plurality of first circuit elements mounted on the first major surface 41 of the mounting substrate 4 and a plurality of second circuit elements incorporated in the mounting substrate 4. In the radio-frequency module 100, the plurality of first circuit elements includes the above-described electronic component E1, the inductors L11, L12, L13 of the hybrid filter 1 and the inductors L31, L32 and the capacitor C32 of the third filter 3. The phrase "the circuit elements are mounted on the first major surface 41 of the mounting substrate 4" includes not only a structure that the circuit elements are disposed on (mechanically connected to) the first major surface 41 of the mounting substrate 4 but also the circuit elements are electrically connected to (appropriate conductor portions of) the mounting substrate 4. In the radio-frequency module 100, the plurality of second circuit elements includes the capacitors C11, C12, C13, C14 of the hybrid filter 1, the capacitor C2, and the inductor L33 and the capacitors C31, C33 of the third filter 3.

The inductor L11 is, for example, a chip inductor. In plan view in the thickness direction D1 of the mounting substrate 4, the outer edge of the inductor L11 has a rectangular shape. Each of the two inductors L12, L13 is, for example, a chip inductor. In plan view in the thickness direction D1 of the mounting substrate 4, the outer edge of each of the two inductors L12, L13 has a rectangular shape.

The inductor L31 is, for example, a chip inductor. In plan view in the thickness direction D1 of the mounting substrate 4, the outer edge of the inductor L31 has a rectangular shape. The inductor L32 is, for example, a chip inductor. In plan view in the thickness direction D1 of the mounting substrate 4, the outer edge of the inductor L32 has a rectangular shape.

In the radio-frequency module 100 according to the first embodiment, as described above, the inductor L11 is the inductor 40 (hereinafter, also referred to as first inductor 40). The first inductor 40 has a rectangular parallelepiped shape. The first inductor 40 includes a rectangular parallelepiped element body 400, the first contact 411, the second contact 412, the winding portion 413 (hereinafter, also referred to as first winding portion 413), the first wiring portion 414, and the second wiring portion 415. The first winding portion 413 is a coil conductor portion. The shape of the first winding portion 413 is, for example, a spiral shape. The first winding portion 413 has, for example, a spiral shape including a plurality of (for example, five) conductor pattern portions 408 (see FIG. 7B) and a plurality of (for example, four) via conductor portions. In the first inductor 40, the plurality of conductor pattern portions 408 and the plurality of via conductor portions are alternately arranged one by one in the thickness direction D1 of the mounting substrate 4, and one ends of adjacent two conductor pattern portions 408 in the thickness direction D1 of the mounting substrate 4 are connected via one via conductor portion. The first winding portion 413 has an electrical conductivity. The element body 400 has electrical insulating properties. The first contact 411 and the second contact 412 are respectively disposed at a first end and a second end of the element body 400 in the long-side direction. The electrically conductive material of each of the first contact 411 and the second contact 412 is, for example, Cu, Ag, or the like. The first winding portion 413 is disposed in the element body 400. The first winding portion 413 is connected between the first contact 411 and the second contact 412. More specifically, the first winding portion 413 has a first end and a second end, the first end of the first winding portion 413 is connected to the first contact 411 via the first wiring portion 414, and the second end of the first winding portion 413 is connected to the second contact 412 via the second wiring portion 415. Examples of the material of the first winding portion 413 include the same electrically conductive materials of the first contact 411 and the second contact 412; however, the configuration is not limited thereto. A winding axis A4 of the first winding portion 413 is an imaginary central axis of the first winding portion 413. The first inductor 40 is a vertically wound inductor. The first inductor 40 is mounted on the mounting substrate 4 such that the winding axis A4 of the first winding portion 413 is parallel to the thickness direction D1 of the mounting substrate 4. As shown in FIGS. 7A and 7B, the first inductor 40 is mounted on the first major surface 41 of the mounting substrate 4 such that the first contact 411 and the second contact 412 are joined with the first major surface 41 of the mounting substrate 4 respectively by a first joining portion 611 and a second joining portion 612 that are in a one-to-one correspondence with the first contact 411 and the second contact 412. The material of each of the first joining portion 611 and the second joining portion 612 is, for example, solder.

Figure 9:
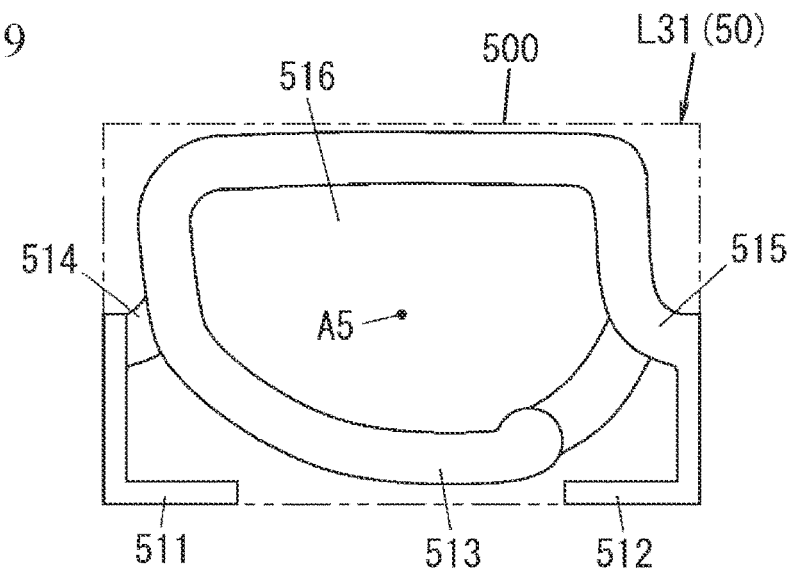
FIG. 9 is a front view of a second inductor in the radio-frequency module.

In the radio-frequency module 100, as described above, the inductor L31 is the second inductor 50. The second inductor 50 has a rectangular parallelepiped shape. As shown in FIG. 9, the second inductor 50 includes, for example, a rectangular parallelepiped element body 500, a first contact 511, a second contact 512, and a second winding portion 513. The second winding portion 513 is a coil conductor portion. The shape of the second winding portion 513 is, for example, a spiral shape. The second winding portion 513 has, for example, a spiral shape including a plurality of (for example, four) conductor pattern portions 508 (see FIG. 5) and a plurality of (for example, three) via conductor portions. In the second inductor 50, the plurality of conductor pattern portions 508 and the plurality of via conductor portions are alternately arranged one by one in the thickness direction D1 of the mounting substrate 4, and one ends of adjacent two conductor pattern portions 508 in the thickness direction D1 of the mounting substrate 4 are connected via one via conductor portion. The second winding portion 513 has an electrical conductivity. The element body 500 has electrical insulating properties. The first contact 511 and the second contact 512 are respectively disposed at a first end and a second end of the element body 500 in the long-side direction. The electrically conductive material of each of the first contact 511 and the second contact 512 is, for example, Cu, Ag, or the like. The second winding portion 513 is disposed in the element body 500. The second winding portion 513 is connected between the first contact 511 and the second contact 512. More specifically, the second winding portion 513 has a first end and a second end, the first end of the second winding portion 513 is connected to the first contact 511 via the first wiring portion 514, and the second end of the second winding portion 513 is connected to the second contact 512 via the second wiring portion 515. Examples of the material of the second winding portion 513 include the same electrically conductive materials of the first contact 511 and the second contact 512; however, the configuration is not limited thereto. A winding axis A5 of the second winding portion 513 is an imaginary central axis of the second winding portion 513. The second inductor 50 is a horizontally wound inductor. The second inductor 50 is disposed on the first major surface 41 of the mounting substrate 4 such that the winding axis A5 of the second winding portion 513 is aligned along the first major surface 41 of the mounting substrate 4. In other words, the second inductor 50 is disposed such that the winding axis A5 of the second winding portion 513 of the second inductor 50 is orthogonal to the thickness direction D1 of the mounting substrate 4. The phrase "the winding axis A5 of the second winding portion 513 of the second inductor 50 is orthogonal to the thickness direction D1 of the mounting substrate 4" is not limited only to the case where the winding axis A5 is strictly orthogonal to the thickness direction D1 of the mounting substrate 4 and may be the case where an angle formed between the winding axis A5 and the thickness direction D1 of the mounting substrate 4 is, for example, 90°±10°. The winding axis A5 of the second inductor 50 is aligned along one direction orthogonal to the thickness direction D1 of the mounting substrate 4. The winding axis A5 of the second winding portion 513 of the second inductor 50 is parallel to the short-side direction of the element body 500 of the inductor L31 in plan view in the thickness direction D1 of the mounting substrate 4. The winding axis A5 of the second winding portion 513 of the second inductor 50 and the short-side direction of the element body 500 are parallel to each other and are not limited to a strictly parallel relation. It is applicable as long as an angle formed between the winding axis A5 and the short-side direction of the element body 500 is smaller than or equal to 10 degrees. The second inductor 50 is mounted on the first major surface 41 of the mounting substrate 4 such that the first contact 511 and the second contact 512 are joined with the first major surface 41 of the mounting substrate 4 respectively by a first joining portion and a second joining portion that are in a one-to-one correspondence with the first contact 511 and the second contact 512. The material of each of the first joining portion and the second joining portion is, for example, solder.

In the radio-frequency module 100 according to the first embodiment, the inductors L1, L2, L3, L12, L13, L32 are vertically wound inductors as well as the inductor L31 (second inductor 50). The inductors L1, L2, L3, L12, L13, L32 are disposed such that the winding axis of the winding portion of each of the inductors L1, L2, L3, L12, L13, L32 is orthogonal to the thickness direction D1 of the mounting substrate 4.

The capacitors C11, C12, C13, C14, C21, C2, C31, C33 are incorporated in the mounting substrate 4. The first capacitor 30 (capacitor C11) has a pair of conductor pattern portions 45 (see FIG. 7A and FIG. 7B) facing in the thickness direction D1 of the mounting substrate 4. Each of the capacitors C12, C13, C14, C21, C2, C31, C33 has a pair of conductor pattern portions facing in the thickness direction D1 of the mounting substrate 4.

As shown in FIG. 7A and FIG. 7B, the resin layer 5 is disposed on the first major surface 41 of the mounting substrate 4. The resin layer 5 includes resin (for example, epoxy resin). The resin layer 5 may include a filler in addition to resin.

The resin layer 5 covers the electronic component E1, the inductors L11, L12, L13, L1, L2, L3, L31, L32, and the capacitor C32. In other words, the resin layer 5 covers the outer periphery of each of the plurality of first circuit elements (electronic components) and the major surface on the side opposite to the mounting substrate 4 side in each of the plurality of first circuit elements. The outer periphery of each of the plurality of first circuit elements includes four side surfaces connecting a first major surface on the mounting substrate 4 side and a second major surface on the side opposite to the mounting substrate 4 side in the circuit element.

The metal electrode layer 6 covers the resin layer 5 and is connected to the ground terminals 107. The metal electrode layer 6 has an electrical conductivity. In the radio-frequency module 100, the metal electrode layer 6 is a shield layer provided for the purpose of electromagnetic shielding of the inside and outside of the radio-frequency module 100. The metal electrode layer 6 has a multilayer structure in which a plurality of metal layers is laminated; however, the configuration is not limited thereto. The metal electrode layer 6 may be a single metal layer. The metal layer includes one or more types of metals. When the metal electrode layer 6 has a multilayer structure in which a plurality of metal layers is laminated, the metal electrode layer 6 includes, for example, a first stainless steel layer, a Cu layer on the first stainless steel layer, and a second stainless steel layer on the Cu layer. The material of each of the first stainless steel layer and the second stainless steel layer is an alloy containing Fe, Ni, and Cr. When the metal electrode layer 6 is a single metal layer, the metal electrode layer 6 is, for example, a Cu layer. The metal electrode layer 6 includes a first conductor portion 61 and a second conductor portion 62. The first conductor portion 61 covers a major surface 51 on the side opposite to the mounting substrate 4 side in the resin layer 5. The second conductor portion 62 covers an outer periphery 53 of the resin layer 5 and the outer periphery 43 of the mounting substrate 4. The outer periphery 43 of the mounting substrate 4 includes four side surfaces connecting the first major surface 41 and the second major surface 42 in the mounting substrate 4. The metal electrode layer 6 is in contact with part of the outer peripheries of the plurality of first ground conductor portions 46 (see FIG. 4) of the mounting substrate 4. The plurality of first ground conductor portions 46 is connected to the ground terminals 107 via the second ground conductor portion 47 (see FIG. 4) larger in area in plan view in the thickness direction D1 of the mounting substrate 4 than each of the plurality of first ground conductor portions 46.

(2.4) Layout of Radio-Frequency Module

As shown in FIG. 2, in the radio-frequency module 100, the first inductor 40 is adjacent to the acoustic wave filter 10 in plan view in the thickness direction D1 of the mounting substrate 4. The phrase "the first inductor 40 is adjacent to the first acoustic wave filter 10 in plan view in the thickness direction D1 of the mounting substrate 4" means that, on the first major surface 41 of the mounting substrate 4, no other circuit element is present between the first inductor 40 and the first acoustic wave filter 10, and the first inductor 40 and the acoustic wave filter 10 are adjacent to each other. In the radio-frequency module 100, the winding axis A4 of the first winding portion 413 of the first inductor 40 is parallel to the thickness direction D1 of the mounting substrate 4. The phrase "the winding axis A4 of the first winding portion 413 is parallel to the thickness direction D1 of the mounting substrate 4" is not limited to the case of a strict parallel relation. It is applicable as long as an angle formed between the winding axis A4 of the first winding portion 413 and the thickness direction D1 of the mounting substrate 4 is smaller than or equal to 10 degrees.

In the radio-frequency module 100, when viewed in the direction of the winding axis A4 of the first winding portion 413 of the first inductor 40, an inner part 416 of the first winding portion 413 in the first inductor 40 does not overlap any of the first input and output electrode 15, the second input and output electrode 16, and the ground electrodes 17, 18 of the first acoustic wave filter 10. In the radio-frequency module 100, the first inductor 40 does not overlap any of the first input and output electrode 15, the second input and output electrode 16, and the ground electrodes 17, 18 of the first acoustic wave filter 10 when viewed in the direction of the winding axis A4 of the first winding portion 413. In the radio-frequency module 100, when viewed in the direction of the winding axis A4 of the first winding portion 413 of the first inductor 40, the inner part 416 of the first winding portion 413 in the first inductor 40 does not overlap any of the first input and output electrode 25, the second input and output electrode 26, and the ground electrodes 27, 28 of the second acoustic wave filter 20. In the radio-frequency module 100, the first inductor 40 does not overlap any of the first input and output electrode 15, the second input and output electrode 16, and the ground electrodes 17, 18 of the second acoustic wave filter 20 when viewed in the direction of the winding axis A4 of the first winding portion 413. The direction of magnetic flux that is generated by the current flowing through the first inductor 40 is a direction along the winding axis A4 of the first winding portion 413 in the inner part 416 of the first winding portion 413.

As shown in FIG. 2, in the radio-frequency module 100, in plan view in the thickness direction D1 of the mounting substrate 4, the first acoustic wave filter 10 is disposed between the first inductor 40 (inductor L11) and the inductors L12, L13 of the hybrid filter 1. The inductors L12, L13 are adjacent to the first acoustic wave filter 10 in plan view in the thickness direction D1 of the mounting substrate 4. The phrase "the inductors L12, L13 are adjacent to the first acoustic wave filter 10 in plan view in the thickness direction D1 of the mounting substrate 4" means that, on the first major surface 41 of the mounting substrate 4, no other circuit element is present between each of the inductors L12, L13 and the first acoustic wave filter 10 and each of the inductors L12, L13, and the first acoustic wave filter 10 are adjacent to each other.

As shown in FIG. 2, in the radio-frequency module 100, the second inductor 50 is adjacent to the first acoustic wave filter 10 in plan view in the thickness direction D1 of the mounting substrate 4. The phrase "the second inductor 50 is adjacent to the first acoustic wave filter 10 in plan view in the thickness direction D1 of the mounting substrate 4" means that, on the first major surface 41 of the mounting substrate 4, no other circuit element is present between the second inductor 50 and the first acoustic wave filter 10 and the second inductor 50, and the first acoustic wave filter 10 are adjacent to each other. In the radio-frequency module 100, the winding axis A5 of the second winding portion 513 of the second inductor 50 is parallel to the second direction D12. The phrase "the winding axis A5 of the second winding portion 513, the thickness direction D1 of the mounting substrate 4, and the second direction D12 are parallel to one another" is not limited to the case of a strict parallel relation. It is applicable as long as an angle formed between the winding axis A5 of the second winding portion 513 and the second direction D12 is smaller than or equal to 10 degrees.

In the radio-frequency module 100, when viewed in the direction of the winding axis A5 of the second winding portion 513 of the second inductor 50 (inductor L31), an inner part 516 of the second winding portion 513 does not overlap any of the first input and output electrode 15, the second input and output electrode 16, and the ground electrodes 17, 18 of the first acoustic wave filter 10. In the radio-frequency module 100, the second inductor 50 does not overlap any of the first input and output electrode 15, the second input and output electrode 16, and the ground electrodes 17, 18 of the first acoustic wave filter 10 when viewed in the direction of the winding axis A5 of the second winding portion 513. In the radio-frequency module 100, when viewed in the direction of the winding axis A5 of the second winding portion 513 of the second inductor 50, the inner part 516 of the second winding portion 513 in the second inductor 50 does not overlap any of the first input and output electrode 25, the second input and output electrode 26, and the ground electrodes 27, 28 of the second acoustic wave filter 20. In the radio-frequency module 100, the second inductor 50 does not overlap any of the first input and output electrode 25, the second input and output electrode 26, and the ground electrodes 27, 28 of the second acoustic wave filter 20 when viewed in the direction of the winding axis A5 of the second winding portion 513. The direction of magnetic flux that is generated by the current flowing through the second inductor 50 is a direction along the winding axis A5 of the second winding portion 513 in the inner part 516 of the second winding portion 513.

In the radio-frequency module 100, the second inductor 50 is arranged next to the second capacitor 60 in the direction of the winding axis A5 of the second winding portion 513 of the second inductor 50. The second capacitor 60 (capacitor C32) is located between the first inductor 40 (inductor L11) and the second inductor 50 (inductor L31) in plan view in the thickness direction D1 of the mounting substrate 4. In the radio-frequency module 100, the second inductor 50 is adjacent to the second capacitor 60 in plan view in the thickness direction D1 of the mounting substrate 4. The phrase "the second inductor 50 is adjacent to the acoustic wave filter 10" means that, on the first major surface 41 of the mounting substrate 4, no other circuit element is present between the second inductor 50 and the second capacitor 60, and the second inductor 50 and the second capacitor 60 are adjacent to each other.

As shown in FIG. 2, in the radio-frequency module 100, the second capacitor 60 (capacitor C32) is adjacent to the first acoustic wave filter 10 in plan view in the thickness direction D1 of the mounting substrate 4. The phrase "the second capacitor 60 is adjacent to the first acoustic wave filter 10 in plan view in the thickness direction D1 of the mounting substrate 4" means that, on the first major surface 41 of the mounting substrate 4, no other circuit element is present between the second capacitor 60 and the first acoustic wave filter 10, and the second capacitor 60 and the first acoustic wave filter 10 are adjacent to each other.

The first capacitor 30 (see FIG. 7A) incorporated in the mounting substrate 4 overlaps the first inductor 40 in plan view in the thickness direction D1 of the mounting substrate 4. In the radio-frequency module 100, in plan view in the thickness direction D1 of the mounting substrate 4, the whole of the first capacitor 30 overlaps part of the first inductor 40; however, the configuration is not limited thereto. For example, the whole of the first capacitor 30 may overlap part of the first inductor 40, the whole of the first capacitor 30 may overlap the whole of the first inductor 40, or part of the first capacitor 30 may overlap the whole of the first inductor 40.

As described above, the mounting substrate 4 has a rectangular shape in plan view in the thickness direction D1 of the mounting substrate 4. As shown in FIG. 3, the first signal terminal 101, the second signal terminal 102, the third signal terminal 103, and the fourth signal terminal 104 are respectively disposed at a first corner portion 421, a second corner portion 422, a third corner portion 423, and a fourth corner portion 424 on the second major surface 42 of the mounting substrate 4. Each of the first signal terminal 101, the second signal terminal 102, the third signal terminal 103, and the fourth signal terminal 104 has a rectangular shape in plan view in the thickness direction D1 of the mounting substrate 4; however, the configuration is not limited thereto, and may have, for example, a circular shape.

In the radio-frequency module 100, the inductor L1 overlaps the first signal terminal 101 in plan view in the thickness direction D1 of the mounting substrate 4. In the radio-frequency module 100, in plan view in the thickness direction D1 of the mounting substrate 4, part of the inductor L1 overlaps part of the first signal terminal 101; however, the configuration is not limited thereto. For example, part of the inductor L1 may overlap the whole of the first signal terminal 101, the whole of the inductor L1 may overlap part of the first signal terminal 101, or the whole of the inductor L1 may overlap the whole of the first signal terminal 101.

In the radio-frequency module 100, the capacitor C13 (see FIG. 4) overlaps the second signal terminal 102 in plan view in the thickness direction D1 of the mounting substrate 4. In the radio-frequency module 100, in plan view in the thickness direction D1 of the mounting substrate 4, part of the capacitor C13 overlaps the whole of the second signal terminal 102; however, the configuration is not limited thereto. For example, the whole of the capacitor C13 may overlap part of the second signal terminal 102, or the whole of the capacitor C13 may overlap the whole of the second signal terminal 102.

In the radio-frequency module 100, the second acoustic wave filter 20 overlaps the third signal terminal 103 in plan view in the thickness direction D1 of the mounting substrate 4. In the radio-frequency module 100, in plan view in the thickness direction D1 of the mounting substrate 4, part of the second acoustic wave filter 20 overlaps part of the third signal terminal 103.

In the radio-frequency module 100, the inductor L33 overlaps the fourth signal terminal 104 in plan view in the thickness direction D1 of the mounting substrate 4. In the radio-frequency module 100, in plan view in the thickness direction D1 of the mounting substrate 4, part of the inductor L33 overlaps part of the fourth signal terminal 104; however, the configuration is not limited thereto. For example, the whole of the inductor L33 may overlap part of the fourth signal terminal 104.

In the radio-frequency module 100, in plan view in the thickness direction D1 of the mounting substrate 4, the first signal terminal 101, the second signal terminal 102, the third signal terminal 103, and the fourth signal terminal 104 do not overlap the second ground conductor portion 47 (see FIG. 4).

In the first inductor 40, the first contact 411 is connected to the common path Ru0 (see FIG. 1), and the second contact 412 is connected to the first acoustic wave filter 10. As shown in FIG. 7A, in the radio-frequency module 100, the shortest distance W1 between the first wiring portion 414 of the first inductor 40 and the metal electrode layer 6 in the thickness direction D1 of the mounting substrate 4 is longer than the shortest distance W2 between the second wiring portion 415 of the first inductor 40 and the metal electrode layer 6 in the thickness direction D1 of the mounting substrate 4.

(3.1) Radio-Frequency Module

The radio-frequency module 100 according to the first embodiment includes the mounting substrate 4, the first signal terminal 101, the second signal terminal 102, the ground terminal 107, and the hybrid filter 1. The mounting substrate 4 has the first major surface 41 and the second major surface 42 facing each other. The first signal terminal 101, the second signal terminal 102, and the ground terminal 107 are disposed on the second major surface 42 of the mounting substrate 4. The hybrid filter 1 is connected between the first signal terminal 101 and the second signal terminal 102. The hybrid filter 1 includes the acoustic wave filter 10 having at least one acoustic wave resonator 14, the inductor 40 having the winding portion 413, and the capacitor 30. The acoustic wave filter 10 has the plurality of outer electrodes connected to the first major surface 41 of the mounting substrate 4. The plurality of outer electrodes includes the first input and output electrode 15 connected to the first signal terminal 101, the second input and output electrode 16 connected to the second signal terminal 102, and the ground electrodes 17, 18 connected to the ground terminal 107. The inductor 40 is disposed on the first major surface 41 of the mounting substrate 4 and is adjacent to the acoustic wave filter 10 in plan view in the thickness direction D1 of the mounting substrate 4. When viewed in the direction of the winding axis A4 of the winding portion 413 of the inductor 40, the inner part 416 of the winding portion 413 in the inductor 40 does not overlap any of the first input and output electrode 15, the second input and output electrode 16, and the ground electrodes 17, 18.

In the radio-frequency module 100 according to the first embodiment, when viewed in the direction of the winding axis A4 of the winding portion 413 of the inductor 40, the inner part 416 of the winding portion 413 in the inductor 40 does not overlap any of the first input and output electrode 15, the second input and output electrode 16, and the ground electrodes 17, 18, so it is possible to suppress electromagnetic coupling between the inductor 40 and each of the first input and output electrode 15, the second input and output electrode 16, and the ground electrodes 17, 18 of the acoustic wave filter 10. Thus, the radio-frequency module 100 is able to suppress a decrease in the characteristics of the hybrid filter 1 due to the influence of magnetic field of the inductor 40 and is able to suppress a decrease in the characteristics of the radio-frequency module 100. More specifically, the radio-frequency module 100 is able to suppress the degradation of attenuation near the pass band of the hybrid filter 1 due to the influence of magnetic field of the inductor 40.

Figure 11:
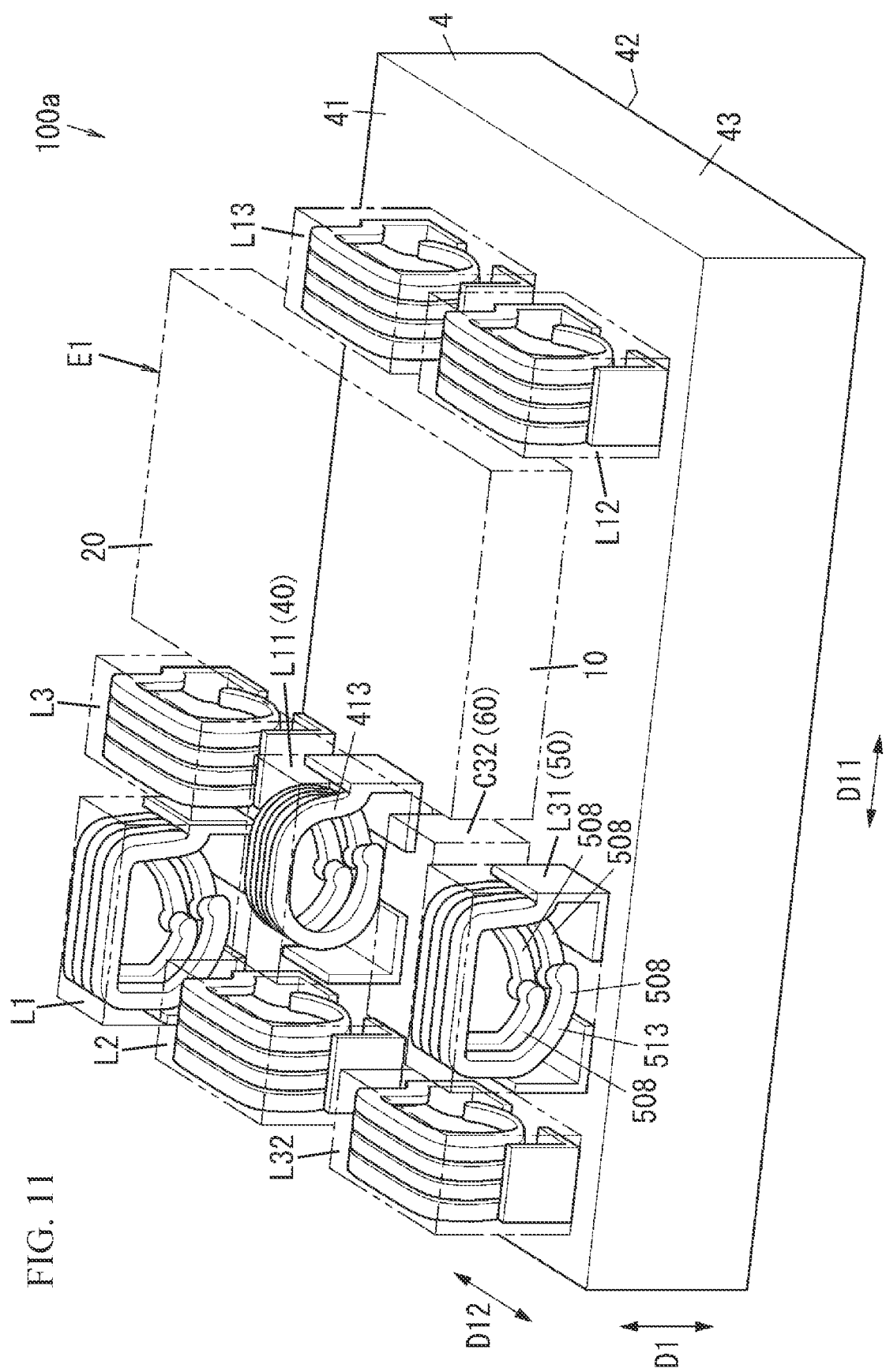
FIG. 11 is a perspective view of a radio-frequency module according to a modification of a first embodiment.

In the radio-frequency module 100 according to the first embodiment, the inductor 40 (inductor L11) is a vertically wound inductor, so, in comparison with the case where the inductor 40 (inductor L11) is a horizontally wound inductor as in the case of the radio-frequency module 100 according to a first modification shown in FIG. 11, it is possible to improve attenuation near the pass band of the hybrid filter 1.

In the radio-frequency module 100, the potential of the second contact 412 of the inductor 40 differs from the potential of the first input and output electrode 25 of the second acoustic wave filter 20. In other words, there is a potential difference between the potential of the second contact 412 of the inductor 40 and the potential of the first input and output electrode 25 of the second acoustic wave filter 20. Here, in the radio-frequency module 100, when viewed in the direction of the winding axis A4 of the winding portion 413 of the inductor 40, the inner part 416 of the winding portion 413 in the inductor 40 does not overlap the first input and output electrode 25 of the second acoustic wave filter 20, so it is possible to suppress electromagnetic coupling between the second contact 412 of the inductor 40 and the first input and output electrode 25 of the second acoustic wave filter 20. Thus, the radio-frequency module 100 is able to suppress electromagnetic coupling between the second contact 412 of the inductor 40 and the first input and output electrode 25 of the second acoustic wave filter 20, which are different in potential from each other, and is able to suppress a decrease in the characteristics of the second filter 2 (see FIG. 1) due to the influence of magnetic field of the inductor 40, so it is possible to suppress a decrease in the characteristics of the radio-frequency module 100.

Figure 12:
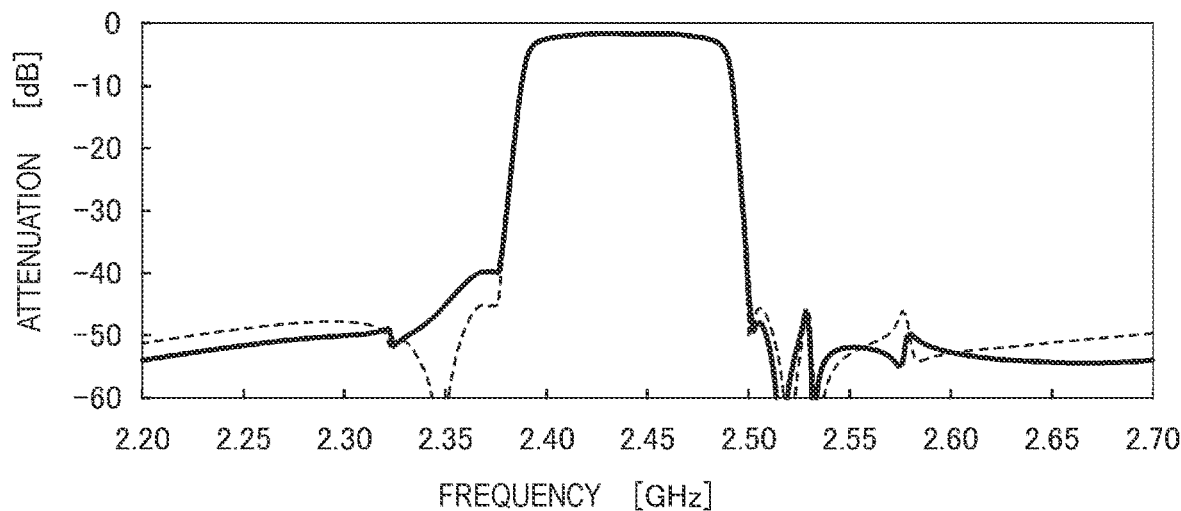
FIG. 12 is a frequency characteristic curve of the attenuation of a second filter in each of a radio-frequency module according to a first modification of the first embodiment and a radio-frequency module according to a second modification of the first embodiment.

Incidentally, since the radio-frequency module 100 according to the first embodiment includes the metal electrode layer 6, the radio-frequency module 100 is able to suppress a change in the characteristics of the hybrid filter 1 due to the influence of electromagnetic waves from outside the radio-frequency module 100. On the other hand, in the radio-frequency module 100 according to the first embodiment, attenuation near the pass band of the second filter 2 can change in comparison with the case where the metal electrode layer 6 is not provided. FIG. 12 is a frequency characteristic curve of the attenuation of each of a second filter in the radio-frequency module according to the first modification and a second filter in a radio-frequency module according to a second modification. In FIG. 12, the continuous line represents the frequency characteristics of the attenuation of the second filter of the radio-frequency module according to the first modification, and the dashed line represents the frequency characteristics of the attenuation of the second filter of the radio-frequency module according to the second modification. The radio-frequency module according to the second modification differs from the radio-frequency module 100 according to the first embodiment in that the metal electrode layer 6 in the radio-frequency module 100 according to the first embodiment is not provided and a horizontally wound inductor is provided instead of the first inductor 40 that is a vertically wound inductor. It is apparent from FIG. 12 that, in the radio-frequency module according to the first modification with the metal electrode layer 6, attenuation near the pass band of the second filter is degraded as compared to the radio-frequency module according to the second modification without the metal electrode layer 6. It is apparent from FIG. 12 that attenuation at 2370 MHz included in the frequency band of 3GPP LTE standard Band 40 is degraded from 45 dB to 40 dB.

Figure 13:
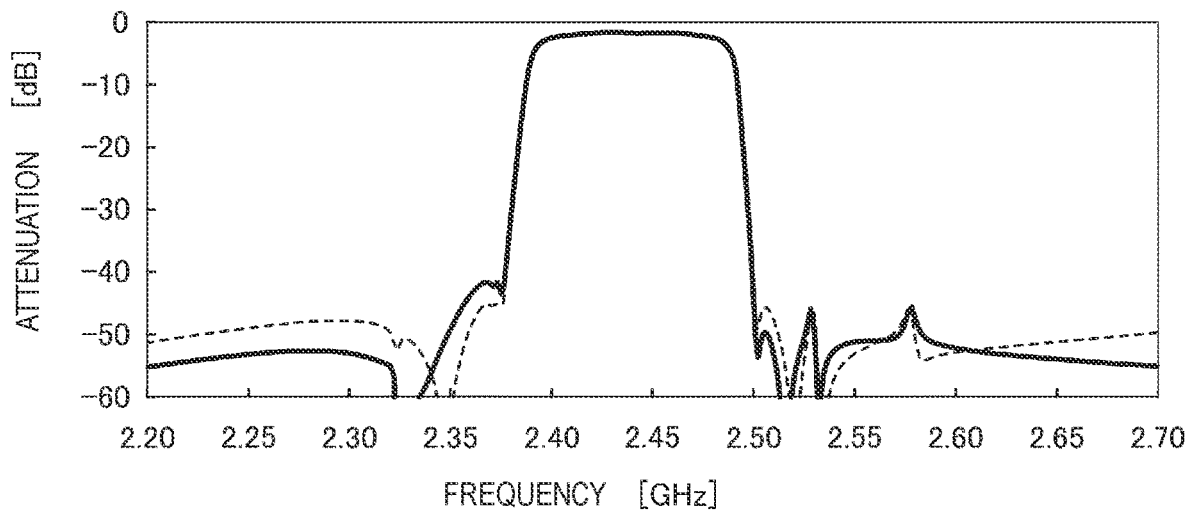
FIG. 13 is a frequency characteristic curve of the attenuation of a second filter in each of the radio-frequency module according to the first embodiment and the radio-frequency module according to the second modification of the first embodiment.

FIG. 13 is a frequency characteristic curve of the attenuation of each of the second filter 2 (see FIG. 1) in the radio-frequency module 100 according to the first embodiment and the second filter in the radio-frequency module according to the second modification. In FIG. 13, the continuous line represents the frequency characteristics of the attenuation of the second filter 2 of the radio-frequency module 100 according to the first embodiment, and the dashed line represents the frequency characteristics of the attenuation of the second filter of the radio-frequency module according to the second modification. It is apparent from FIG. 12 and FIG. 13 that, in the radio-frequency module 100 according to the first embodiment, the degradation of attenuation near the pass band of the second filter 2 is suppressed as compared to the radio-frequency module according to the first modification in which the inductor 40 is a horizontally wound inductor. It is apparent from FIG. 13 that attenuation at 2370 MHz included in the frequency band of 3GPP LTE standard Band 40 is improved to 42 dB.

The radio-frequency module 100 according to the first embodiment includes the resin layer 5 that covers the first inductor 40 and the acoustic wave filter 10 as described above, and the metal electrode layer 6 that covers the resin layer 5. Here, in the first inductor 40, the first contact 411 is connected to the common path Ru0, and the second contact 412 is connected to the first acoustic wave filter 10. In the radio-frequency module 100, the shortest distance W1 between the first wiring portion 414 of the first inductor 40 and the metal electrode layer 6 in the thickness direction D1 of the mounting substrate 4 is longer than the shortest distance W2 between the second wiring portion 415 of the first inductor 40 and the metal electrode layer 6 in the thickness direction D1 of the mounting substrate 4. Thus, in comparison with the case where the first wiring portion 414 and the second wiring portion 415 of the first inductor 40 are disposed such that the shortest distance W1 is shorter than the shortest distance W2, the radio-frequency module 100 according to the first embodiment is able to suppress coupling of the first wiring portion 414 of the first inductor 40 with a path between the second input and output electrode 26 of the second acoustic wave filter 20 and the third signal terminal 103 via the metal electrode layer 6. Thus, the radio-frequency module 100 according to the first embodiment is able to improve isolation between the first input and output electrode 25 and the second input and output electrode 26 of the second acoustic wave filter 20, so it is possible to suppress a decrease in the characteristics of the second filter 2.

(3.2) Communication Device

The communication device 300 according to the first embodiment includes the radio-frequency module 100, and a signal processing circuit 301 connected to the radio-frequency module 100. Thus, the communication device 300 is able to suppress a decrease in the characteristics of the radio-frequency module 100.

Second Embodiment

Figure 14:
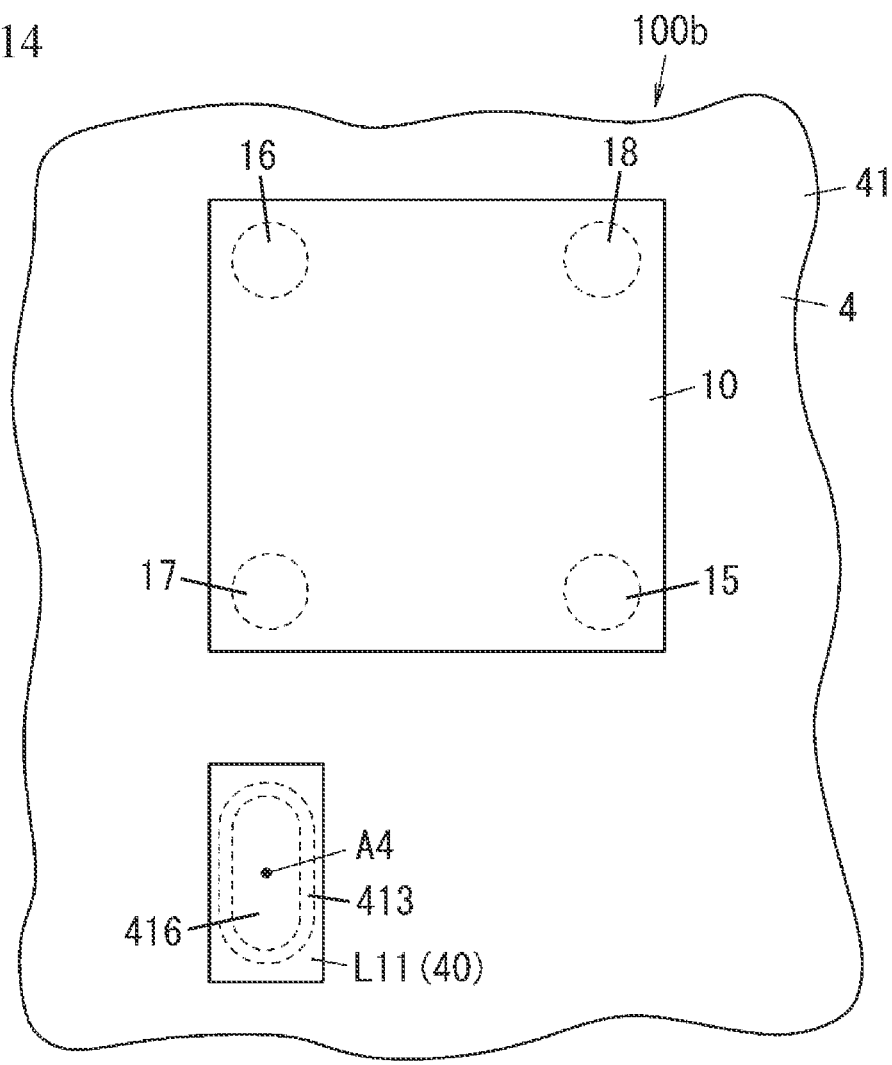
FIG. 14 is a plan view of a radio-frequency module according to a second embodiment.

A radio-frequency module 100b according to a second embodiment will be described with reference to FIG. 14. For the radio-frequency module 100b according to the second embodiment, like reference signs denote component elements similar to those of the radio-frequency module 100 according to the first embodiment, and the description is omitted.

The radio-frequency module 100b according to the second embodiment differs from the radio-frequency module 100 according to the first embodiment in that the second filter 2 and the third filter 3 in the radio-frequency module 100 according to the first embodiment are not provided. The radio-frequency module 100b includes the acoustic wave filter 10 instead of the electronic component E1 (see FIG. 2) that includes the acoustic wave filter 10 (first acoustic wave filter 10) and the second acoustic wave filter 20. In the radio-frequency module 100b according to the second embodiment, in plan view in the thickness direction D1 of the mounting substrate 4, the inductor 40 and the acoustic wave filter 10 are adjacent to each other in the short-side direction of the inductor 40.

In the radio-frequency module 100b, the shortest distance between the ground electrode 17 of the acoustic wave filter 10 and the inductor 40 (inductor L11) is shorter than each of the shortest distance between the first input and output electrode 15 of the acoustic wave filter 10 and the inductor 40, the shortest distance between the second input and output electrode 16 and the inductor 40, and the shortest distance between the ground electrode 18 and the inductor 40. In the radio-frequency module 100b, the potential of the inductor 40 is equal to the potential of the first input and output electrode 15 of the acoustic wave filter 10. In the radio-frequency module 100b, the potential of the inductor 40 differs from the potential of the ground electrode 17 of the acoustic wave filter 10. In other words, there is a potential difference between the potential of the inductor 40 and the potential of the ground electrode 17 of the acoustic wave filter 10. Here, in the radio-frequency module 100b, when viewed in the direction of the winding axis A4 of the winding portion 413 of the inductor 40, the inner part 416 of the winding portion 413 in the inductor 40 does not overlap the ground electrode 17, so it is possible to suppress electromagnetic coupling between the inductor 40 and the ground electrode 17 of the acoustic wave filter 10. Thus, the radio-frequency module 100b is able to suppress electromagnetic coupling between the inductor 40 and the ground electrode 17, which are different in potential from each other, and is able to suppress a decrease in the characteristics of the hybrid filter 1 (see FIG. 1) due to the influence of magnetic field of the inductor 40, so it is possible to suppress a decrease in the characteristics of the radio-frequency module 100b. More specifically, the radio-frequency module 100b is able to suppress the degradation of attenuation near the pass band of the hybrid filter 1 due to the influence of magnetic field of the inductor 40.

Figure 15:
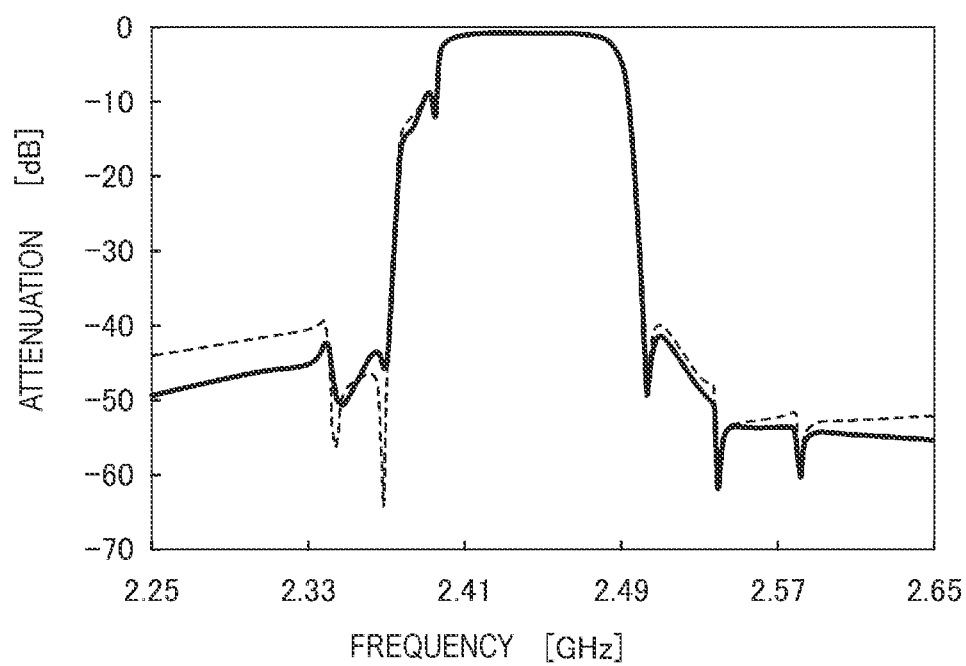
FIG. 15 is a frequency characteristic curve of the attenuation of a hybrid filter in the radio-frequency module.

FIG. 15 is a frequency characteristic curve of the attenuation of each of the hybrid filter 1 (see FIG. 1) in the radio-frequency module 100*b* according to the second embodiment and a hybrid filter in a radio-frequency module according to a first comparative example. In FIG. 15, the continuous line represents the frequency characteristics of the attenuation of the hybrid filter 1 of the radio-frequency module 100*b* according to the second embodiment, and the dashed line represents the frequency characteristics of the attenuation of the hybrid filter of the radio-frequency module according to the first comparative example. The radio-frequency module according to the first comparative example differs from the radio-frequency module 100 according to the first embodiment in that the winding portion 413 of the inductor 40 overlaps the ground electrode 17 when viewed along the winding axis A4 of the winding portion 413 of the inductor 40. It is apparent from FIG. 15 that, in the radio-frequency module 100*b* according to the second embodiment, the degradation of attenuation of the hybrid filter 1 is suppressed as compared to the radio-frequency module according to the first comparative example.

Third Embodiment

Figure 16:
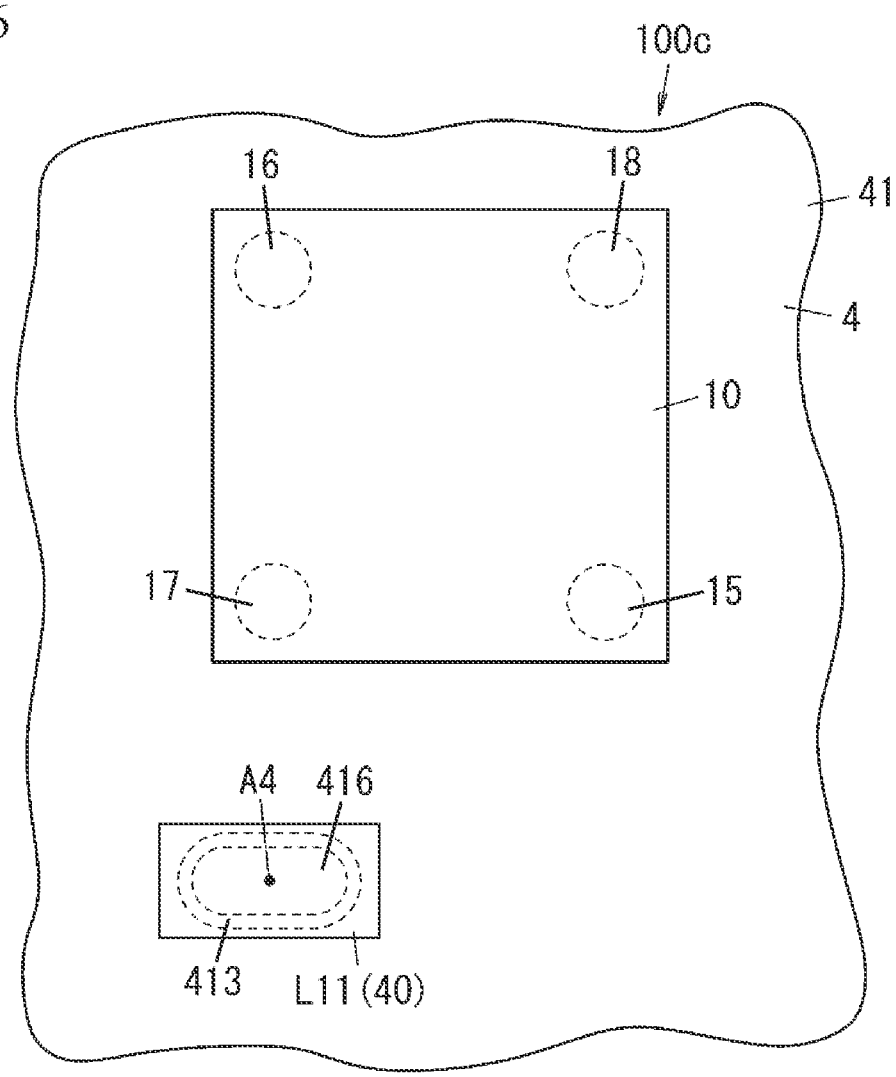
FIG. 16 is a plan view of a relevant part of a radio-frequency module according to a third embodiment.

A radio-frequency module 100*c* according to a third embodiment will be described with reference to FIG. 16. For the radio-frequency module 100*c* according to the third embodiment, like reference signs denote component elements similar to those of the radio-frequency module 100*b* according to the second embodiment, and the description is omitted.

The radio-frequency module 100*c* according to the third embodiment differs from the radio-frequency module 100*b* according to the second embodiment in that, in plan view in the thickness direction D1 of the mounting substrate 4, the inductor 40 and the acoustic wave filter 10 are adjacent to each other in the short-side direction of the inductor 40.

In the radio-frequency module 100*c*, as well as the radio-frequency module 100*b*, when viewed in the direction of the winding axis A4 of the winding portion 413 of the inductor 40, the inner part 416 of the winding portion 413 in the inductor 40 does not overlap the ground electrode 17, so it is possible to suppress electromagnetic coupling between the inductor 40 and the ground electrode 17 of the acoustic wave filter 10. Thus, the radio-frequency module 100*c* is able to suppress electromagnetic coupling between the inductor 40 and the ground electrode 17, which are different in potential from each other, and is able to suppress a decrease in the characteristics of the hybrid filter 1 (see FIG. 1) due to the influence of magnetic field of the inductor 40, so it is possible to suppress a decrease in the characteristics of the radio-frequency module 100*c*. More specifically, the radio-frequency module 100*c* is able to suppress the degradation of attenuation near the pass band of the hybrid filter 1 due to the influence of magnetic field of the inductor 40.

Fourth Embodiment

Figure 17:
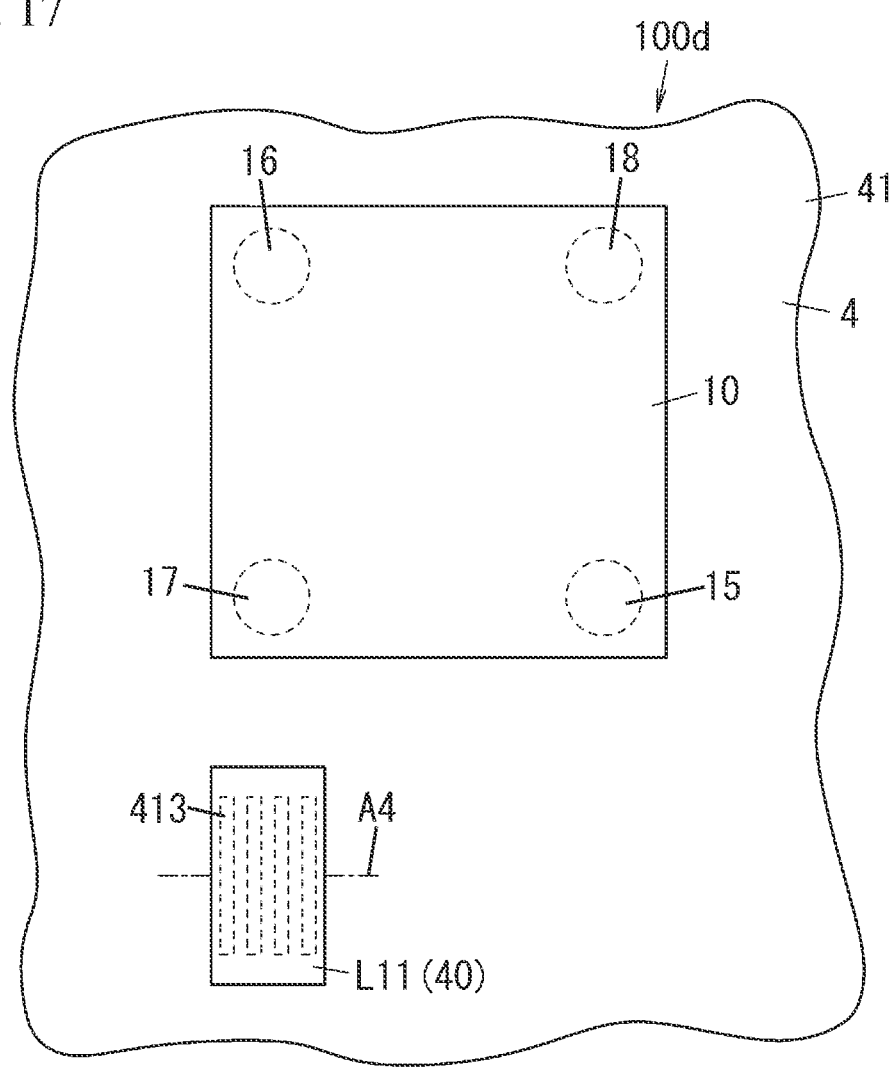
FIG. 17 is a plan view of a relevant part of a radio-frequency module according to a fourth embodiment.

A radio-frequency module 100*d* according to a fourth embodiment will be described with reference to FIG. 17. For the radio-frequency module 100*d* according to the fourth embodiment, like reference signs denote component elements similar to those of the radio-frequency module 100*b* according to the second embodiment, and the description is omitted.

The radio-frequency module 100*d* according to the fourth embodiment differs from the radio-frequency module 100*b* according to the second embodiment in that the inductor 40 is a horizontally wound inductor and the winding axis A4 of the winding portion 413 of the inductor 40 is aligned along the short-side direction of the inductor 40.

In the radio-frequency module 100*d*, when viewed in the direction of the winding axis A4 of the winding portion 413 of the inductor 40, the inner part of the winding portion 413 in the inductor 40 does not overlap the ground electrode 17, so it is possible to suppress electromagnetic coupling between the inductor 40 and the ground electrode 17 of the acoustic wave filter 10. Thus, the radio-frequency module 100*d* is able to suppress electromagnetic coupling between the inductor 40 and the ground electrode 17, which are different in potential from each other, and is able to suppress a decrease in the characteristics of the hybrid filter 1 (see FIG. 1) due to the influence of magnetic field of the inductor 40, so it is possible to suppress a decrease in the characteristics of the radio-frequency module 100*d*. More specifically, the radio-frequency module 100*d* is able to suppress the degradation of attenuation near the pass band of the hybrid filter 1 due to the influence of magnetic field of the inductor 40.

Fifth Embodiment

Figure 18:
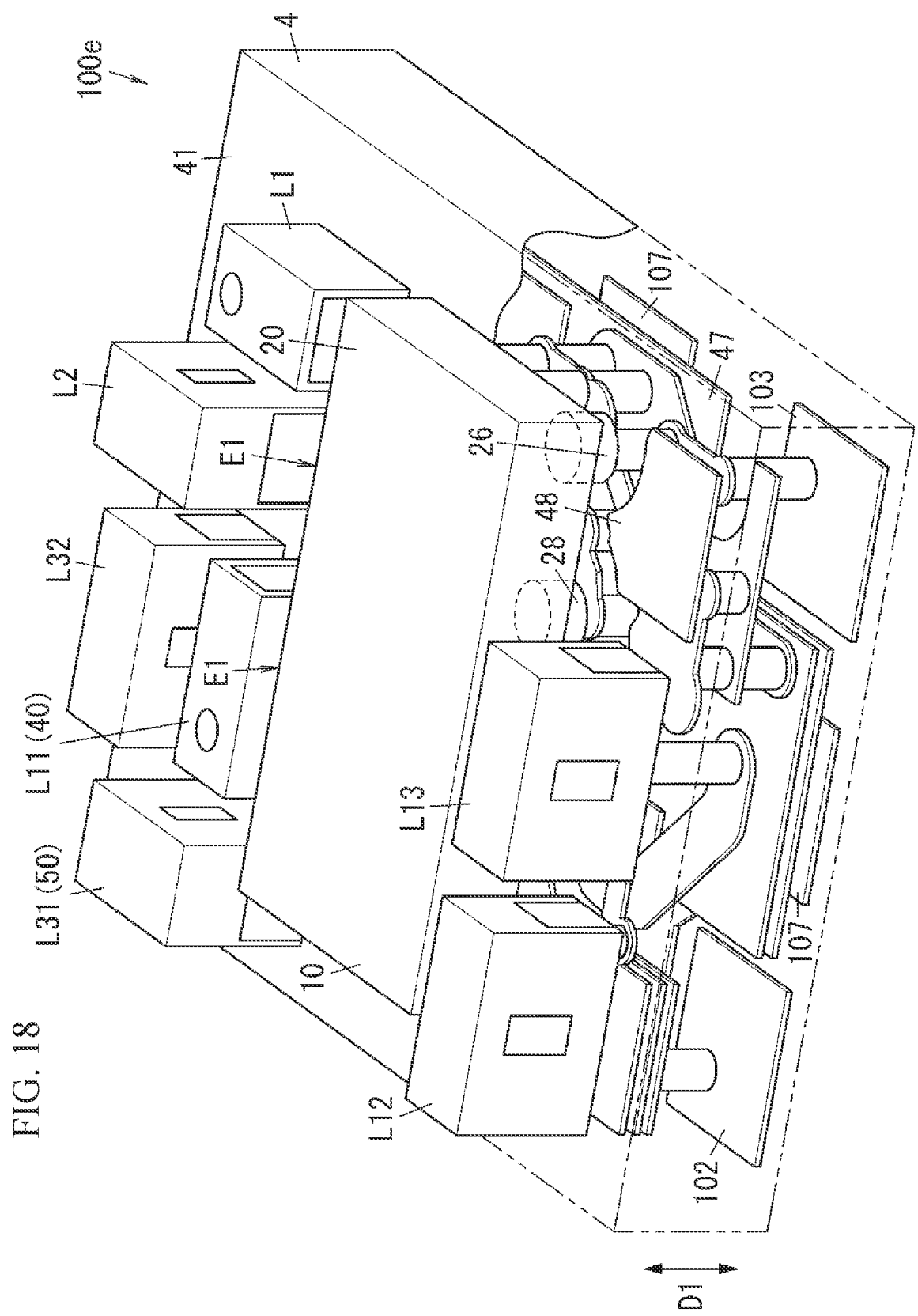
FIG. 18 shows a radio-frequency module according to a fifth embodiment and is a see-through perspective view of the inside of a mounting substrate.

A radio-frequency module 100*e* according to a fifth embodiment will be described with reference to FIG. 18. For the radio-frequency module 100*e* according to the fifth embodiment, like reference signs denote component elements similar to those of the radio-frequency module 100 according to the first embodiment, and the description is omitted.

In plan view in the thickness direction of the mounting substrate 4, the third signal terminal 103 does not overlap any of a plurality of circuit elements disposed on or in the mounting substrate 4. The plurality of circuit elements includes the electronic component E1, the inductors L11, L12, L13 of the hybrid filter 1, the inductors L31, L32 and the capacitor C32 of the third filter 3, the capacitors C11, C12, C13, C14 of the hybrid filter 1, the capacitor C2, and the inductor L33 and the capacitors C31, C33 of the third filter 3.

The radio-frequency module 100 according to the fifth embodiment is able to suppress electromagnetic coupling between the third signal terminal 103 and the plurality of circuit elements, so it is possible to improve isolation between the first input and output electrode 25 and the second input and output electrode 26 of the second acoustic wave filter 20. Thus, the radio-frequency module 100*e* is able to suppress the degradation of the frequency characteristics of attenuation.

Figure 19:
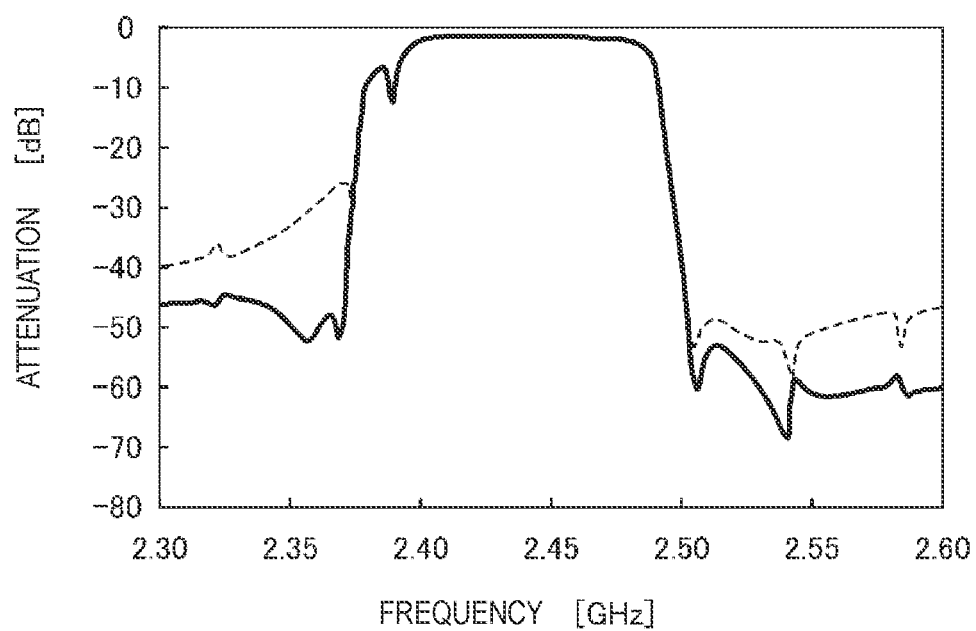
FIG. 19 is a frequency characteristic curve of the attenuation of a second filter in the radio-frequency module.

FIG. 19 is a frequency characteristic curve of the attenuation of each of the second filter 2 (see FIG. 1) in the radio-frequency module 100*e* according to the fifth embodiment and a second filter in a radio-frequency module according to a second comparative example. In FIG. 19, the continuous line represents the frequency characteristics of the attenuation of the second filter 2 of the radio-frequency module 100*e* according to the fifth embodiment, and the dashed line represents the frequency characteristics of the attenuation of the second filter of the radio-frequency module according to the second comparative example. The radio-frequency module according to the second comparative example differs from the radio-frequency module 100 according to the fifth embodiment in that the third signal terminal 103 overlaps an inductor disposed on the mounting substrate 4 in plan view in the thickness direction of the mounting substrate 4. It is apparent from FIG. 19 that, in the radio-frequency module 100*e* according to the fifth embodiment, the degradation of attenuation of the second filter 2 is suppressed as compared to the radio-frequency module according to the second comparative example.

Modifications

The above-described first to fifth embodiments each are just one of various embodiments of the present disclosure. The above-described first to fifth embodiments each may be modified into various forms according to design, or the like, as long as the possible benefit of the present disclosure is achieved.

For example, the multiplexer 110 that is a component of the radio-frequency module 100 is not limited to a triplexer and may be a diplexer that includes only two filters, that is, the first filter 1 and the second filter 2, among the hybrid filter (first filter 1), the second filter 2, and the third filter 3. Alternatively, the multiplexer 110 may be a quadplexer that includes a fourth filter in addition to the first filter 1, the second filter 2, and the third filter 3.

Each of the radio-frequency modules 100, 100*a*, 100*e* includes the electronic component E1 that includes the first acoustic wave filter 10 and the second acoustic wave filter 20; however, the configuration is not limited thereto. Each of the radio-frequency modules 100, 100*a*, 100*e* may include the first acoustic wave filter 10 and the second acoustic wave filter 20 as individual electronic components.

The second capacitor 60 adjacent to the inductor 40 of the hybrid filter 1 is not limited to the capacitor C32 of the third filter 3 and may be, for example, the capacitor C11 of the hybrid filter 1. The second inductor 50 adjacent to the second capacitor 60 on the side opposite to the inductor 40 side when viewed from the second capacitor 60 is not limited to the inductor L31 of the third filter 3 and may be, for example, the inductor L12 of the hybrid filter 1.

It is applicable as long as, in each of the radio-frequency modules 100, 100*a*, 100*b*, 100*c*, 100*d*, 100*e*, the metal electrode layer 6 covers at least part of the resin layer 5 and at least part of the outer periphery 43 of the mounting substrate 4. For example, the metal electrode layer 6 may have an opening that exposes part of the major surface 51 of the resin layer 5. The metal electrode layer 6 may be in contact with the major surface on the side opposite to the mounting substrate 4 side in the acoustic wave filter 10. In each of the radio-frequency modules 100, 100*a*, 100*b*, 100*c*, 100*d*, 100*e*, the structure that the metal electrode layer 6 reaches the outer edge 432 of the second major surface 42 of the mounting substrate 4 is not indispensable.

In the radio-frequency module 100*e*, in plan view in the thickness direction D1 of the mounting substrate 4, the third signal terminal 103 does not overlap any of the plurality of circuit elements disposed on or in the mounting substrate 4; however, the configuration is not limited thereto. In plan view in the thickness direction D1 of the mounting substrate 4, at least one of the first signal terminal 101, the second signal terminal 102, and the third signal terminal 103 may be disposed so as not to overlap any of the plurality of circuit elements disposed on or in the mounting substrate 4.

The circuit configuration of each of the radio-frequency modules 100, 100*a*, 100*e* is not limited to the example of FIG. 1.

The first acoustic wave filter 10 is not limited to a surface acoustic wave filter and may be a bulk acoustic wave filter. In a bulk acoustic wave filter, each of the plurality of acoustic wave resonators 14 is a bulk acoustic wave (BAW) resonator.

The second acoustic wave filter 20 is not limited to a surface acoustic wave filter and may be a bulk acoustic wave filter. In a bulk acoustic wave filter, each of the plurality of acoustic wave resonators 24 is a BAW resonator.

The first acoustic wave filter 10 is not limited to a π filter and may be a ladder filter. It is applicable as long as the first acoustic wave filter 10 includes at least one acoustic wave resonator 14.

Each of the first acoustic wave filter 10 and the second acoustic wave filter 20 may be, for example, an acoustic wave filter that uses boundary acoustic waves, plate waves, or the like.

The circuit configuration of the radio-frequency circuit 200 is not limited to the example of FIG. 1. The radio-frequency circuit 200 may include, for example, a radio-frequency front-end circuit that supports multi input multi output (MIMO) or supports evolved-universal terrestrial radio access new radio dual connectivity (ENDO).

Aspects

The following aspects are disclosed in the specification.

A radio-frequency module (100; 100*a*; 100*b*; 100*c*; 100*d*; 100*e*) according to a first aspect includes a mounting substrate (4), a first signal terminal (101), a second signal terminal (102), a ground terminal (107), and a hybrid filter (1). The mounting substrate (4) has a first major surface (41) and a second major surface (42) facing each other. The first signal terminal (101), the second signal terminal (102), and the ground terminal (107) are disposed on the second major surface (42) of the mounting substrate (4). The hybrid filter (1) is connected between the first signal terminal (101) and the second signal terminal (102). The hybrid filter (1) includes an acoustic wave filter (10) including at least one acoustic wave resonator (14), an inductor (40) having a winding portion (413), and a capacitor (30). The acoustic wave filter (10) has a plurality of outer electrodes connected to the first major surface (41) of the mounting substrate (4). The plurality of outer electrodes includes a first input and output electrode (15) connected to the first signal terminal (101), a second input and output electrode (16) connected to the second signal terminal (102), and a ground electrode (17) connected to the ground terminal (107). The inductor (40) is disposed on the first major surface (41) of the mounting substrate (4) and is adjacent to the acoustic wave filter (10) in plan view in a thickness direction (D1) of the mounting substrate (4). When viewed in a direction of a winding axis (A4) of the winding portion (413) of the inductor (L40), an inner part (416) of the winding portion (413) in the inductor (L11) does not overlap any of the first input and output electrode (15), the second input and output electrode (16), and the ground electrode (17).

With the radio-frequency module (100; 100*a*; 100*b*; 100*c*; 100*d*; 100*e*) according to the first aspect, when viewed in the direction of the winding axis (A4) of the winding portion (413) of the inductor (40), the inner part (416) of the winding portion (413) in the inductor (40) does not overlap any of the first input and output electrode (15), the second input and output electrode (16), and the ground electrode (17), so it is possible to suppress electromagnetic coupling between the inductor (40) and the first input and output electrode (15), the second input and output electrode (16), and the ground electrode (17) of the acoustic wave filter (10). Thus, with the radio-frequency module (100; 100*a*; 100*b*; 100*c*; 100*d*;

100e), it is possible to suppress a decrease in the characteristics of the radio-frequency module (100; 100a; 100b; 100c; 100d; 100e).

In a radio-frequency module (100; 100a; 100b; 100c; 100e) according to a second aspect, in the first aspect, the winding axis (A4) of the winding portion (413) of the inductor (40) is parallel to the thickness direction (D1) of the mounting substrate (4).

With the radio-frequency module (100; 100a; 100b; 100c; 100e) according to the second aspect, it is possible to further suppress a decrease in the characteristics of the radio-frequency module (100; 100a; 100b; 100c; 100e).

A radio-frequency module (100; 100a) according to a third aspect may further include a second inductor (50) different from a first inductor (40) that is the inductor (40), and a second capacitor (60) different from a first capacitor (30) that is the capacitor (30) in the first or second aspect. The second inductor (50) has a second winding portion (513) different from a first winding portion (413) that is the winding portion (413) of the inductor (40). The second capacitor (60) is disposed on the first major surface (41) of the mounting substrate (4). The second inductor (50) is disposed on the first major surface (41) of the mounting substrate (4). When viewed in a direction of a winding axis (A5) of the second winding portion (513) of the second inductor (50), an inner part (516) of the second winding portion (513) does not overlap any of the first input and output electrode (15), the second input and output electrode (16), and the ground electrode (17). The second capacitor (60) is located between the first inductor (40) and the second inductor (50) in plan view in the thickness direction (D1) of the mounting substrate (4).

With the radio-frequency module (100; 100a) according to the third aspect, it is possible to suppress electromagnetic coupling between the first inductor (40) and the second inductor (50), so it is possible to suppress a decrease in the characteristics of the hybrid filter (1).

In a radio-frequency module (100; 100a) according to a fourth aspect, in the third aspect, the winding axis (A5) of the second winding portion (513) of the second inductor (50) is orthogonal to the winding axis (A4) of the first winding portion (413) of the first inductor (40).

With the radio-frequency module (100; 100a) according to the fourth aspect, it is possible to further suppress electromagnetic coupling between the first inductor (40) and the second inductor (50).

A radio-frequency module (100; 100a; 100b; 100c; 100d; 100e) according to a fifth aspect may further include a resin layer (5) and a metal electrode layer (6) in any one of the first to fourth aspects. The resin layer (5) is disposed on the first major surface (41) of the mounting substrate (49. The resin layer (5) covers at least part of the acoustic wave filter (10) and the inductor. The metal electrode layer (6) covers at least part of the resin layer (5) and at least part of an outer periphery (43) of the mounting substrate (4). The metal electrode layer (6) is connected to the ground terminal (107).

With the radio-frequency module (100; 100a; 100b; 100c; 100d; 100e) according to the fifth aspect, it is possible to suppress the degradation of the characteristics of the hybrid filter (1) due to the influence of electromagnetic waves from outside the radio-frequency module (100; 100a; 100b; 100c; 100d; 100e).

A radio-frequency module (100; 100a; 100b) according to a sixth aspect further includes a third signal terminal (103), and a second filter (2) different from a first filter (1) that is the hybrid filter (1), in any one of the first to fourth aspects. The third signal terminal (103) is disposed on the second major surface (42) of the mounting substrate (4). The second filter (2) is connected between the first signal terminal (101) and the third signal terminal (103).

The radio-frequency module (100; 100a; 100e) according to the sixth aspect may be used as a multiplexer (110) that includes the first filter (1) and the second filter (2).

In a radio-frequency module (100; 100a; 100e) according to a seventh aspect, in the sixth aspect, the second filter (2) includes a second acoustic wave filter (20) different from a first acoustic wave filter (10) that is the acoustic wave filter (10). The second filter (2) has a plurality of second outer electrodes (a first input and output electrode 25, a second input and output electrode 26, and two ground electrodes 27, 28) different from a plurality of first outer electrodes that is the plurality of outer electrodes of the first filter (1).

In a radio-frequency module (100; 100a; 100e) according to an eighth aspect, in the seventh aspect, the first acoustic wave filter (10) includes a first substrate (substrate 1000). The second acoustic wave filter (20) includes a second substrate (substrate 1000). The first substrate and the second substrate are the same.

A radio-frequency module (100; 100a; 100e) according to a ninth aspect may further include a resin layer (5) and a metal electrode layer (6) in any one of the sixth to eighth aspects. The resin layer (5) is disposed on the first major surface (41) of the mounting substrate (4). The resin layer (5) covers at least part of the acoustic wave filter (10) and the inductor. The metal electrode layer (6) covers at least part of the resin layer (5) and at least part of an outer periphery (43) of the mounting substrate (4). The metal electrode layer (6) is connected to the ground terminal (107). The inductor (40) includes a first contact (411), a second contact (412), a first wiring portion (414), and a second wiring portion (415). The first contact (411) and the second contact (412) are connected to the first major surface (41) of the mounting substrate (4). The first wiring portion (414) connects a first end of the winding portion (413) to the first contact (411). The second wiring portion (415) connects a second end of the winding portion (413) to the second contact (412). In the inductor (40), the first contact (411) is connected to a common path (Ru0) of a first path (Ru1) between the first filter (1) and the first signal terminal (101) and a second path (Ru2) between the second filter (2) and the first signal terminal (101), and the second contact (412) is connected to the acoustic wave filter (10). A shortest distance (W1) between the first wiring portion (414) and the metal electrode layer (6) in the thickness direction (D1) of the mounting substrate (4) is longer than a shortest distance (W2) between the second wiring portion (415) and the metal electrode layer (6) in the thickness direction (D1) of the mounting substrate (4).

With the radio-frequency module (100; 100a; 100e) according to the ninth aspect, in comparison with the case where the first wiring portion (414) and the second wiring portion (415) of the first inductor (40) are disposed such that the shortest distance (W1) is shorter than the shortest distance (W2), it is possible to suppress coupling of the first wiring portion (414) of the first inductor (40) with a path between the second acoustic wave filter (20) and the third signal terminal (103) via the metal electrode layer (6). Thus, the radio-frequency module (100) according to the ninth aspect is able to improve isolation between the first input and output electrode (25) and the second input and output electrode (26) of the second acoustic wave filter (20), so it is possible to suppress a decrease in the characteristics of the second filter (2).

A radio-frequency module according to a tenth aspect further includes a fourth signal terminal (104) and a third filter (3) in any one of the sixth to ninth aspects. The fourth signal terminal (104) is disposed on the second major surface (42) of the mounting substrate (4). The third filter (3) is connected between the first signal terminal (101) and the fourth signal terminal (104). The third filter (3) includes a second inductor (50) and a second capacitor (60).

In a radio-frequency module (100; 100*a*; 100*b*) according to an eleventh aspect, in any one of the sixth to tenth aspects, in plan view in the thickness direction of the mounting substrate (4), the third signal terminal (103) does not overlap any of a plurality of circuit elements disposed on or in the mounting substrate (4). The plurality of circuit elements includes the acoustic wave filter (10), the inductor (40), and the capacitor (30).

The radio-frequency module (100; 100*a*; 100*b*; 100*e*) according to the eleventh aspect is able to suppress electromagnetic coupling between the third signal terminal (103) and the plurality of circuit elements, so it is possible to improve isolation between the first input and output electrode (25) and the second input and output electrode (26) of the second acoustic wave filter (20). Thus, the radio-frequency module (100*e*) is able to suppress the degradation of the frequency characteristics of attenuation.

A communication device (300) according to a twelfth aspect includes the radio-frequency module (100; 100*a*; 100*b*; 100*c*; 100*d*; 100*e*) according to any one of the first to eleventh aspects, and a signal processing circuit (301). The signal processing circuit (301) is connected to the radio-frequency module (100; 100*a*; 100*b*; 100*c*; 100*d*; 100*e*).

The communication device (300) according to the twelfth aspect is able to suppress a decrease in the characteristics of the radio-frequency module (100; 100*a*; 100*b*; 100*c*; 100*d*; 100*e*).

What is claimed is:

1. A radio-frequency module comprising:
   a mounting substrate having a first major surface and a second major surface facing each other;
   a first signal terminal, a second signal terminal, and a ground terminal disposed on the second major surface of the mounting substrate;
   a hybrid filter connected between the first signal terminal and the second signal terminal and including an acoustic wave filter having at least one acoustic wave resonator, an inductor having a winding portion, and a capacitor;
   a resin layer disposed on the first major surface of the mounting substrate and covering at least part of the acoustic wave filter and the inductor; and
   a metal electrode layer covering at least part of the resin layer and at least part of an outer periphery of the mounting substrate and connected to the ground terminal, wherein:
   the acoustic wave filter includes a plurality of outer electrodes connected to the first major surface of the mounting substrate,
   the plurality of outer electrodes includes a first input and output electrode connected to the first signal terminal, a second input and output electrode connected to the second signal terminal, and a ground electrode connected to the ground terminal,
   the inductor is disposed on the first major surface of the mounting substrate and is adjacent to the acoustic wave filter in plan view in a thickness direction of the mounting substrate, and
   when viewed in a direction of a winding axis of the winding portion of the inductor, an inner part of the winding portion in the inductor does not overlap any of the first input and output electrode, the second input and output electrode, and the ground electrode.

2. The radio-frequency module according to claim 1, wherein the winding axis of the winding portion of the inductor is parallel to the thickness direction of the mounting substrate.

3. The radio-frequency module according to claim 2, further comprising:
   a second inductor different from a first inductor that is the inductor; and
   a second capacitor different from a first capacitor that is the capacitor, wherein
   the second inductor has a second winding portion different from a first winding portion that is the winding portion of the inductor,
   the second capacitor is disposed on the first major surface of the mounting substrate,
   the second inductor is disposed on the first major surface of the mounting substrate,
   when viewed in a direction of a winding axis of the second winding portion of the second inductor, an inner part of the second winding portion does not overlap any of the first input and output electrode, the second input and output electrode, and the ground electrode, and
   the second capacitor is located between the first inductor and the second inductor in plan view in the thickness direction of the mounting substrate.

4. The radio-frequency module according to claim 2, further comprising:
   a third signal terminal disposed on the second major surface of the mounting substrate; and
   a second filter different from a first filter that is the hybrid filter and connected between the first signal terminal and the third signal terminal.

5. The radio-frequency module according to claim 1, further comprising:
   a second inductor different from a first inductor that is the inductor; and
   a second capacitor different from a first capacitor that is the capacitor, wherein
   the second inductor has a second winding portion different from a first winding portion that is the winding portion of the inductor,
   the second capacitor is disposed on the first major surface of the mounting substrate,
   the second inductor is disposed on the first major surface of the mounting substrate,
   when viewed in a direction of a winding axis of the second winding portion of the second inductor, an inner part of the second winding portion does not overlap any of the first input and output electrode, the second input and output electrode, and the ground electrode, and
   the second capacitor is located between the first inductor and the second inductor in plan view in the thickness direction of the mounting substrate.

6. The radio-frequency module according to claim 5, wherein the winding axis of the second winding portion of the second inductor is orthogonal to the winding axis of the first winding portion of the first inductor.

7. The radio-frequency module according to claim 6, further comprising:
   a third signal terminal disposed on the second major surface of the mounting substrate; and a second filter different from a first filter that is the hybrid filter and connected between the first signal terminal and the third signal terminal.

8. The radio-frequency module according to claim 5, further comprising:
a third signal terminal disposed on the second major surface of the mounting substrate; and
a second filter different from a first filter that is the hybrid filter and connected between the first signal terminal and the third signal terminal.

9. The radio-frequency module according to claim 1, further comprising:
a third signal terminal disposed on the second major surface of the mounting substrate; and
a second filter different from a first filter that is the hybrid filter and connected between the first signal terminal and the third signal terminal.

10. The radio-frequency module according to claim 9, wherein
the second filter includes a second acoustic wave filter different from a first acoustic wave filter that is the acoustic wave filter, and
the second filter has a plurality of second outer electrodes different from a plurality of first outer electrodes that is the plurality of outer electrodes of the first filter.

11. The radio-frequency module according to claim 10, wherein
the first acoustic wave filter includes a first substrate,
the second acoustic wave filter includes a second substrate, and
the first substrate and the second substrate are the same.

12. The radio-frequency module according to claim 10, wherein
the inductor further includes a first contact and a second contact connected to the first major surface of the mounting substrate, a first wiring portion connecting a first end of the winding portion to the first contact, and a second wiring portion connecting a second end of the winding portion to the second contact, and
in the inductor, the first contact is connected to a common path of a first path between the first filter and the first signal terminal and a second path between the second filter and the first signal terminal, the second contact is connected to the acoustic wave filter, and a shortest distance between the first wiring portion and the metal electrode layer in the thickness direction of the mounting substrate is longer than a shortest distance between the second wiring portion and the metal electrode layer in the thickness direction of the mounting substrate.

13. The radio-frequency module according to claim 9, wherein
the inductor further includes a first contact and a second contact connected to the first major surface of the mounting substrate, a first wiring portion connecting a first end of the winding portion to the first contact, and a second wiring portion connecting a second end of the winding portion to the second contact, and
in the inductor, the first contact is connected to a common path of a first path between the first filter and the first signal terminal and a second path between the second filter and the first signal terminal, the second contact is connected to the acoustic wave filter, and a shortest distance between the first wiring portion and the metal electrode layer in the thickness direction of the mounting substrate is longer than a shortest distance between the second wiring portion and the metal electrode layer in the thickness direction of the mounting substrate.

14. The radio-frequency module according to claim 9, further comprising:
a fourth signal terminal disposed on the second major surface of the mounting substrate; and
a third filter connected between the first signal terminal and the fourth signal terminal and including a third inductor and a third capacitor.

15. The radio-frequency module according to claim 9, wherein
in plan view in the thickness direction of the mounting substrate, the third signal terminal does not overlap any of a plurality of circuit elements disposed on or in the mounting substrate, and
the plurality of circuit elements includes the acoustic wave filter, the inductor, and the capacitor.

16. A communication device comprising:
the radio-frequency module according to claim 1; and
a signal processing circuit connected to the radio-frequency module.

* * * * *